(12) United States Patent
Lin et al.

(10) Patent No.: US 7,381,604 B2
(45) Date of Patent: Jun. 3, 2008

(54) STRAINED-CHANNEL SEMICONDUCTOR STRUCTURE AND METHOD FOR FABRICATING THE SAME

(75) Inventors: Chun-Chieh Lin, Taichung (TW); Yee-Chia Yeo, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 186 days.

(21) Appl. No.: 11/423,457

(22) Filed: Jun. 12, 2006

(65) Prior Publication Data

US 2006/0220119 A1 Oct. 5, 2006

Related U.S. Application Data

(62) Division of application No. 10/655,255, filed on Sep. 4, 2003, now Pat. No. 7,078,742.

(51) Int. Cl.
*H01L 21/336* (2006.01)
(52) U.S. Cl. ................. 438/197; 438/300; 257/190
(58) Field of Classification Search ............... None
See application file for complete search history.

(56) References Cited

U.S. PATENT DOCUMENTS

| | | | |
|---|---|---|---|
| 6,573,563 B2 | 6/2003 | Lee et al. | |
| 6,621,131 B2 | 9/2003 | Murthy et al. | |
| 6,878,592 B1 | 4/2005 | Besser et al. | |
| 6,930,335 B2 | 8/2005 | Yamaguchi et al. | |
| 7,307,273 B2 * | 12/2007 | Currie | .......... 257/18 |
| 7,323,391 B2 * | 1/2008 | Arghavani | .......... 438/285 |

FOREIGN PATENT DOCUMENTS

| | | |
|---|---|---|
| CN | 1830392 | 9/2006 |
| JP | 10-012883 | 1/1998 |
| JP | 1012883 | 1/1998 |

OTHER PUBLICATIONS

CN Office Action mailed May 25, 2007.

* cited by examiner

*Primary Examiner*—David E Graybill
(74) *Attorney, Agent, or Firm*—Thomas, Kayden, Horstemeyer & Risley

(57) ABSTRACT

A strained-channel semiconductor structure and method of fabricating the same. The strained-channel semiconductor structure comprises a substrate composed of a first semiconductor material with a first natural lattice constant. A channel region is disposed in the substrate and a gate stack is disposed over the strained channel region. A pair of source/drain regions are oppositely disposed in the substrate adjacent to the channel region, wherein each of the source/drain regions comprises a lattice-mismatched zone comprising a second semiconductor material with a second natural lattice constant rather than the first natural lattice constant, an inner side and an outer side corresponding to the gate stack, and at least one outer sides laterally contacts the first semiconductor material of the substrate.

36 Claims, 18 Drawing Sheets

US 7,381,604 B2

STRAINED-CHANNEL SEMICONDUCTOR STRUCTURE AND METHOD FOR FABRICATING THE SAME

CROSS-REFERENCE TO RELATED APPLICATION

This application is a Divisional of U.S. patent application Ser. No. 10/655,255, filed Sep. 4, 2003 now U.S. Pat. No. 7,078,742 and entitled "STRAINED-CHANNEL SEMICONDUCTOR STRUCTURE AND METHOD FOR FABRICATING THE SAME".

BACKGROUND OF THE INVENTION

1. Field of the Invention

The present invention relates to a semiconductor structure. More particularly, it relates to a strained-channel semiconductor structure and method of fabricating the same.

2. Description of the Related Art

Size reduction of the metal-oxide-semiconductor field-effect transistor (MOSFET), including reduction of gate length and gate oxide thickness, has enabled continuous improvement in performance, reduced density, and cost per unit of integrated circuits.

In order to further enhance transistor performance, strain can be introduced in the transistor channel to improve carrier mobility and device scaling. There are several existing approaches to introducing strain in a transistor channel region.

In one conventional approach, as described in the paper entitled "NMOS and PMOS transistors fabricated in strained silicon/relaxed silicon-germanium structures", by J. Welser et al., published at the December 1992 International Electron Devices Meeting held in San Francisco, Calif., pp. 1000-1002, a relaxed silicon germanium (SiGe) buffer layer 110 is provided beneath channel region 126, as shown in FIG. 1A.

In FIG. 1B and FIG. 1C, a simple model of different lattice constants is used to show the intersection between relaxed SiGe layer 114 of buffer layer 110 and strained-Si layer 130. In FIG. 1B, model 135 shows the natural lattice constant of Si, smaller than that of SiGe shown by model 115. In FIG. 1C, when a thin layer of epitaxial Si (model 135) is grown on the relaxed SiGe layer 114 (model 115), unit cell 136 of Si shown in model 135 is subject to biaxial tensile strain by lateral stretching. The thin layer of epitaxial Si becomes strained-Si layer 130 shown in FIG. 1A.

In FIG. 1A, a transistor formed on the epitaxial strained-Si layer 130 has a channel region 126 under biaxial tensile strain. In this approach, relaxed SiGe layer 114 is a stressor that introduces strain in channel region 126. The stressor, in this case, is placed below channel region 126. Significant mobility enhancement has been reported for both electrons and holes in bulk transistors using a silicon channel under biaxial tensile strain. In the aforementioned approach, the epitaxial silicon layer 130 is strained before forming the transistor.

Hence, there are concerns about possible strain relaxation resulting from subsequent high temperature CMOS processes. Further, the approach is very expensive as the SiGe buffer layer 110 with a thickness on the order of micrometers must be grown. Numerous dislocations exist in relaxed SiGe layer 114, some of which propagate to the strained-Si layer 130, resulting in high defect density, thereby negatively affecting transistor performance.

Moreover, another approach is disclosed in U.S. patent application No. 2003/0080361 by A. Murthy et. al., entitled "Semiconductor transistor having a stressed channel", and an approach with strain in a channel region by stressors disposed on adjacent sides of the channel region is introduced.

In addition, a pMOSFET with a SiGe source/drain and a SiGe quantum well channel is described in detail in a paper disclosed by Ouyang et. al., entitled "Two-dimensional bandgap engineering in a novel Si/SiGe PMOSFET with enhanced device performance and scalability", published in pp. 151-154 of the Simulation of Semiconductor Processes and Devices (SISPAD).

In FIG. 2, the cross section of the semiconductor transistor with a gate structure G is shown and the elements of the gate stack 203 thereof are omitted for simplicity. In FIG. 2, the gate stack 203 is disposed over the surface of a semiconductor substrate, for example a silicon substrate 200, between two isolation regions 202 formed in the silicon substrate 200. In addition, two doped regions 204a and 204b are disposed in the silicon substrate 200 between the isolation regions 202 and located on opposing sides of the gate stack 203. A channel region 208 is further formed in the silicon substrate 200 between the doped regions 204a and 204b. Films 206a and 206b including silicon, germanium and boron are epitaxially formed in the respective region above the doped regions 204a and 204b disposed on opposing sides of the gate stack 203 and act as stressors.

In such a semiconductor transistor, the outer sidewall of the film 206a or 206b corresponding to the channel region 208 entirely contacts the adjacent isolation region 202 and the strain caused by each stressor (referring to the film 206a and the film 206b) to the channel region 208 is partially buffered by the adjacent isolation region 202 thereof such that the magnitude of a strain in the channel region 208 is not optimized and can thus be reduced.

Photon area 210 in FIG. 2 is further enlarged and shown in FIG. 3 to illustrate the atomic arrangement of the isolation region 202 and portions of the channel region (referring to the doped region 204a and the adjacent channel region 208) adjacent to the stressor (referring to the film 206a) therein. At this point, the doped region 204a comprises the same material as the silicon substrate 200 and the atomic arrangement thereof is an atomic arrangement of silicon atoms 210, having a lattice constant in nature. In the film 206a, the atomic arrangement is an atomic arrangement of material such as epitaxially formed silicon germanium (SiGe) 212 here, having another lattice constant in nature greater than that of silicon atoms 210 of the adjacent doped region 204a.

In addition, the film 206a also contacts the isolation region 202 on the left side. The isolation regions 202 are usually filled with the amorphous material such as silicon oxide 214 and a hetero-junction of proper atomic arrangements cannot be constituted between the amorphous material of the isolation region 202 and the film 206a. Thus, the amorphous material, for example silicon oxide 214, in the isolation region 202 does not force the atoms of material of the stressor to be arranged in any specific way.

Further, the silicon oxide 214 filled in the isolation region 202 has a smaller Young's modulus (about 69 GPa) than that of the silicon material (about 170 GPa) in the channel region (referring to the doped region 204a and the channel region 208) and results in a lager strain under a fixed stress. Thus, the isolation region 202 filled with silicon oxide is more compressive or stretchable than the channel region of the silicon material and the magnitude of a strain in the channel region 208 close to the doped region 204a provided by the stressor (referring to the film 206*a* here) can be partially buffered by the silicon oxide of the adjacent isolation region 202 such that the strain in the channel region 208 is not optimized and can thus be reduced.

Thus, the present invention provides a strained-channel semiconductor structure to enhance the strain in the channel region by improving the location and design of the stressors therein.

SUMMARY OF THE INVENTION

Accordingly, the main object of the present invention is to provide a semiconductor structure having a strained-channel transistor.

Another object of the present invention is to provide a strained-channel semiconductor structure having a transistor array comprising a plurality of strained-channel transistors where the source/drain regions adjacent to each strained channel region thereof is lattice mismatched with respect to the channel region.

Another object of the present invention is to provide a strained-channel semiconductor structure having at least one strained-channel transistor. The outer side of the lattice-mismatched zones of the source/drain regions thereof on each end laterally contacts the first semiconductor material of the adjacent substrate such that strain exerted thereof will not be buffered or reduced by the material of the adjacent isolation region.

Another object of the present invention is to provide a method of a fabricating a strained-channel semiconductor structure having at least one strained-channel transistor.

In order to achieve the above objects, the present invention provides a strained-channel semiconductor structure, comprising a substrate composed of a first semiconductor material with a first natural lattice constant. A strained channel region is disposed in the substrate and a gate stack is disposed over the strained channel region, comprising a gate dielectric layer and a gate electrode sequentially stacked thereon. A pair of source/drain regions are oppositely disposed in the substrate adjacent to the strained channel region, wherein each of the source/drain regions comprises a lattice-mismatched zone comprising a second semiconductor material with a second natural lattice constant rather than the first natural lattice constant, an inner side and an outer side with respect to the gate stack, and at least one outer sides laterally contacts the first semiconductor material of the substrate.

In one preferred embodiment, one isolation region can be disposed in the substrate adjacent to one source/drain regions not contacting the outer side of the lattice-mismatched zone adjacent source/drain region, with a distance of more than 50 Å therebetween.

In another preferred embodiment, the isolation region can be a tapered isolation region and substantially contacts the outer side of the lattice-mismatched zone adjacent source/drain region, with an average distance of more than 50 Å therebetween.

In another preferred embodiment, two isolation regions can be respectively disposed in the substrate adjacent to the source/drain regions and neither contacts the outer side of the lattice-mismatched zone adjacent source/drain regions, with a distance of more than 50 Å therebetween.

In another preferred embodiment, at least one isolation regions can be tapered isolation region substantially contacting the outer side of the lattice-mismatched zone adjacent source/drain region, with an average distance of more than 50 Å therebetween.

Additionally, the other isolation region does not contact the outer side of the lattice-mismatched zone adjacent source/drain region, with a distance of more than 50 Å therebetween.

In order to achieve the above objects, the present invention provides another strained-channel semiconductor structure, the semiconductor structure comprises a substrate composed of a first semiconductor material with a first natural lattice constant and a plurality of strained channel regions are separately disposed in the substrate. A gate array comprising a plurality of gate stacks and each gate stack comprises a gate dielectric layer and a gate electrode sequentially stacked over the strained channel region and a plurality of source/drain regions are alternatively disposed in the substrate adjacent to the strained channel regions, wherein each source/drain region comprises a lattice-mismatched zone comprising a second semiconductor material with a second natural lattice constant and an inner side and an outer side corresponding to the adjacent gate stack thereof, and at least one outer side of the lattice-mismatched zones adjacent to each end of the gate array laterally contacts the first semiconductor material of the substrate.

In one preferred embodiment, one isolation region can be disposed in the substrate adjacent to one source/drain region on each end not contacting the outer side of the lattice-mismatched zone adjacent source/drain region, with a distance of more than 50 Å therebetween.

In another preferred embodiment, the isolation region can be a tapered isolation region and substantially contacts the outer side of the lattice-mismatched zone adjacent to the source/drain region, with an average distance of more than 50 Å therebetween.

In one preferred embodiment, two isolation regions can be respectively disposed in the substrate adjacent to each of the source/drain regions adjacent to each end of the gate array and do not contact the outer sides of the lattice-mismatched zones of the adjacent source/drain regions, with a distance of more than 50 Å therebetween, wherein one or both the isolation regions can be tapered isolation regions substantially contacting the outer side of the lattice-mismatched zone adjacent source/drain region, with an average distance of more than 50 Å therebetween. In addition, the other isolation region does not contact the outer side of the lattice-mismatched zone adjacent source/drain region, with a distance of more than 50 Å therebetween.

The present invention further provides a method of fabricating a strained-channel semiconductor structure. First, a substrate with an active area thereon is provided, wherein the substrate composed of a first semiconductor material with a first natural lattice constant, and the active area is defined by at least one isolation region formed in the substrate. Then at least one first gate stack is formed over the active area, wherein each first gate stack comprises a gate dielectric layer, a gate electrode layer, and a mask layer sequentially stacked over a portion of the substrate. Next, the substrate is etched to form a plurality of recesses in the substrate adjacent to the first gate stack. Then each recess is filled with a second semiconductor material comprising a second natural lattice constant rather than the first natural lattice constant as a lattice-mismatched zone. Next, the mask layer of each first gate stack is removed to leave at least one second gate stack over the substrate and a pair of adjacent lattice-mismatched zones in the substrate in the active area, wherein each lattice-mismatched zone has an inner side and an outer side corresponding to the adjacent second gate stack and the outer side of one of the lattice-mismatched zones on each end of the active area is spaced substantially apart from the isolation region by the first semiconductor material of the substrate.

Further, a second spacer is formed on sidewalls of each second gate stack and substantially covers a portion of the adjacent lattice-mismatched zones thereof. Then a pair of source/drain regions is formed in the substrate adjacent to each second gate stack to form at least one MOS transistor, wherein each source/drain region comprises the lattice-mismatched zone.

In one preferred embodiment, the isolation region can be a tapered isolation and the outer side of one of the lattice-mismatched zones on each end substantially contacts the upper corner of the tapered isolation region.

In another preferred embodiment, the outer side of one of the lattice-mismatched zones on each end does not contact the isolation region.

In another preferred embodiment, the isolation region can have a raised isolation region with a overhanging portion above and covering the substrate in the adjacent active area such that the outer side of one of the lattice-mismatched zones formed in the substrate on each end of the active area do not contact portions of the raised isolation region in the substrate.

In addition, during the step of etching the substrate to form a plurality of recesses in the substrate in the active area further comprising the steps of forming at least one mask pattern over the isolation region, substantially covering the isolation region and a portion of the substrate of the adjacent active area thereof such that the outer side of one of the lattice-mismatched zones formed in the substrate on each end of the active area do not contact the isolation region in the substrate.

In another preferred embodiment, the active area can be defined by two isolation regions formed in the substrate and the outer side of each of the lattice-mismatched zones on each end of the active area is spaced substantially apart from the isolation region by the first semiconductor material of the substrate.

In another preferred embodiment, the isolation regions can be tapered isolation regions and the outer side of each of the lattice-mismatched zones on each end substantially contacts the upper corner of the adjacent tapered isolation region thereof.

In another preferred embodiment, one isolation regions can be tapered isolation regions and the outer side of the lattice-mismatched zones on one end substantially contacts the upper corner of the tapered isolation region. At this point, the outer side of the lattice-mismatched zones on the other end does not contact the adjacent isolation region.

In another preferred embodiment, the outer sides of the lattice-mismatched zones on each end do not contact the isolation region.

In the present invention, the non-contact or the slight contact between the isolation region and the adjacent lattice-mismatched zone, acting as a stressor to exert force or stress on the channel region, the strain on the strained-channel region exerted by the lattice-mismatched zone is not easily reduced and buffered by the adjacent isolation region and the strain on the strained-channel region can be optimized.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following embodiments are intended to illustrate the invention more fully without limiting their scope, since numerous modifications and variations will be apparent to those skilled in this art.

First Embodiment

A method of fabricating the strained-channel semiconductor structure of the invention is illustrated in FIGS. 4a to 4h.

Figure 4A:
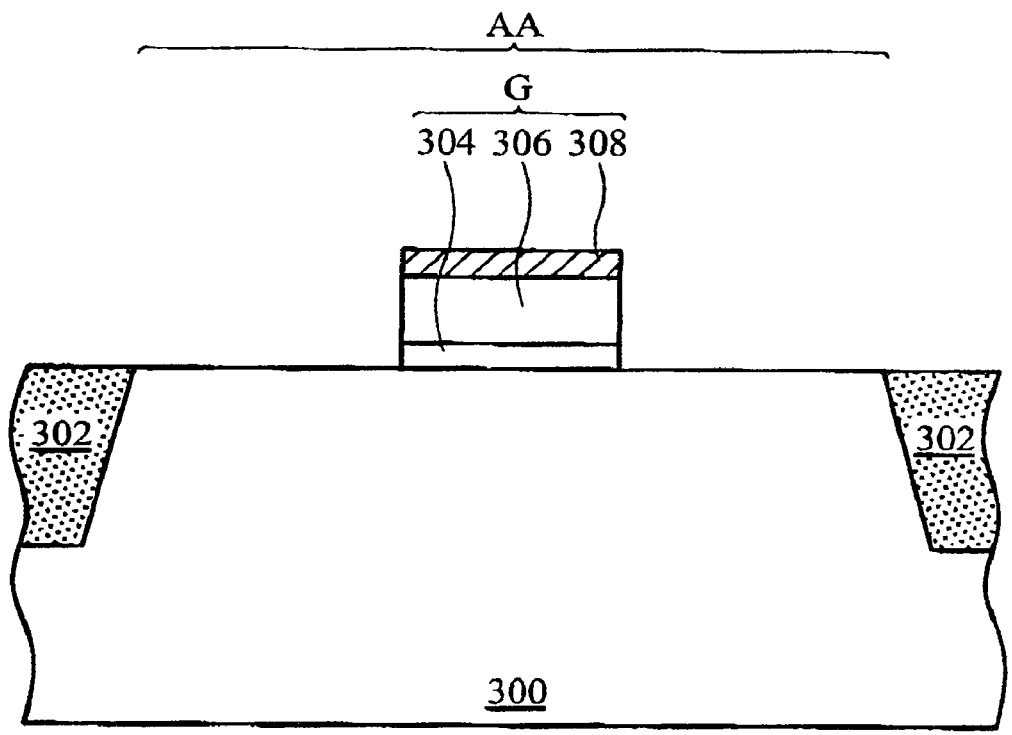
FIGS. 4a through 4h are cross sections illustrating strained-channel semiconductor structures in accordance with the first embodiment of the present invention.

In FIG. 4a, a substrate 300 of a first semiconductor material is provided. The substrate 300 may comprise a plurality of active areas (not shown) for forming devices thereon defined by a plurality of isolation structures (not shown) formed in the substrate 300, however an active area AA defined by two adjacent isolation regions 302 shown in FIG. 4a is provided to simplify the description. The first semiconductor material of the substrate 300 can be elemental, alloy or compound semiconductor material and is preferably an elemental semiconductor material such as silicon. The isolation region 302 can be, for example, a conventional shallow trench isolation (STI) region.

Next, a first gate stack G including a gate dielectric layer 304, a gate electrode layer 306, and a mask layer 308 sequentially stacked over a portion of the substrate 300 is formed in the active area AA. The gate dielectric layer 304 can be formed by thermal oxidation, thermal oxidation followed by nitridation, chemical vapor deposition, physical vapor deposition such as sputtering, or other known techniques to form a gate dielectric layer. The gate dielectric layer 304 can be silicon dioxide, silicon nitride, silicon oxynitride, or combinations thereof with a thickness from about 3 Å to 100 Å, preferably approximately 10 Å or less. The gate dielectric layer 304 can also be a high permittivity (high-k) material with a relative permittivity greater than 8 such as aluminum oxide ($Al_2O_3$), hafnium oxide ($HfO_2$), zirconium oxide ($ZrO_2$), hafnium oxynitride (HfON), hafnium silicate ($HfSiO_4$), zirconium silicate ($ZrSiO_4$), lanthanum oxide ($La_2O_3$), or combinations thereof with an equivalent oxide thickness of between about 3 Å to 100 Å. The gate electrode 306 can be polycrystalline-silicon (poly-Si), poly-crystalline silicon-germanium (poly-SiGe), refractory metal such as molybdenum or tungsten, compounds such as titanium nitride, combinations thereof, or another conductive material. In addition, implants known as workfunction implants can be introduced in the gate electrode 306 to alter the workfunction thereof. The mask layer 308 can be silicon nitride or silicon dioxide formed by chemical vapor deposition (CVD).

The gate stack G is formed by sequentially forming a dielectric layer (not shown), a gate electrode material layer (not shown) and a mask material layer (not shown) over the substrate 300. Then the mask material layer is patterned to form a mask layer 308 for defining gate electrode 306 and the gate electrode material layer and the dielectric layer are subsequently etched using the mask layer 308 as an etching mask to form the gate electrode 306 and the gate dielectric layer 304 and finally the mask layer 308 is formed thereon. Thus, the gate electrode 306 is electrically isolated from the channel region by the gate dielectric layer 304. The gate dielectric layer 304 is preferably silicon oxynitride and gate electrode 306 is preferably poly-silicon etched using chlorine and bromine with a high etching selectivity respective to the gate dielectric later 304 when the substrate 300 comprises silicon material.

Figure 4B:
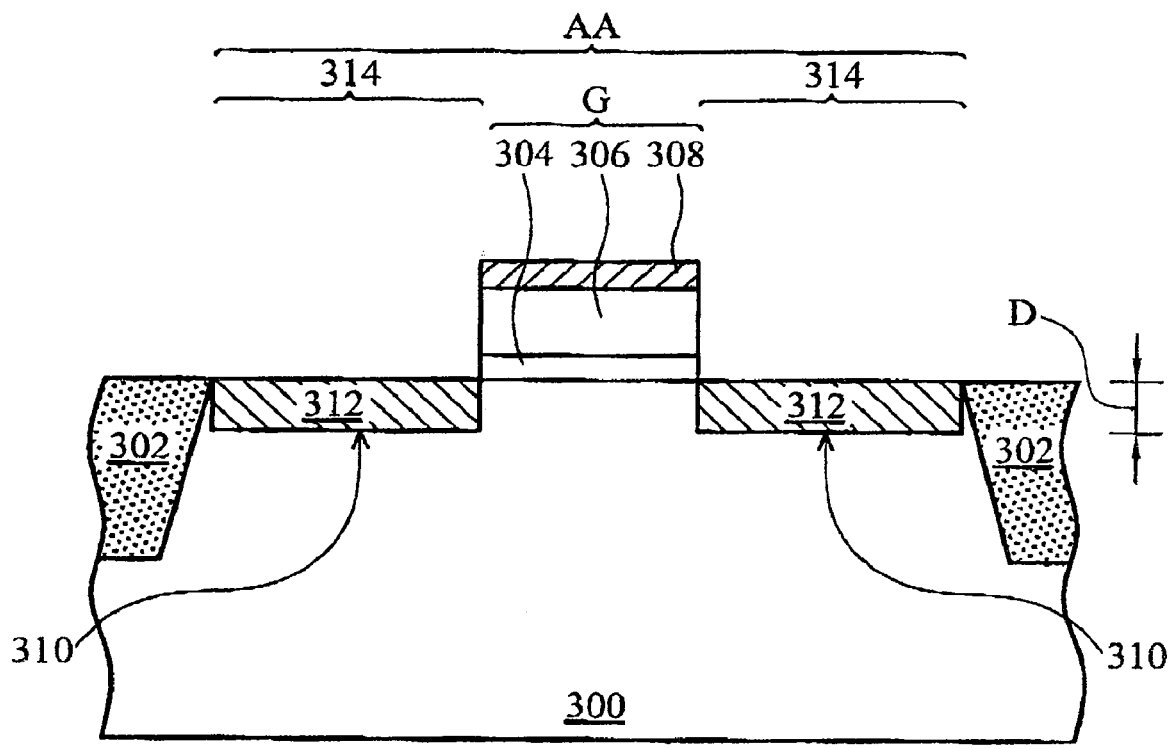

In FIG. 4b, an etching step (not shown), for example a plasma dry etching, is performed to etch the substrate 300 in the active area AA exposed by the first gate stack G. Recesses 310 with a depth D are then formed on opposing sides of the substrate 300 adjacent to the first gate stack G. The depth D of each recess 310 can range from 50 Å to 2000 Å and preferably from 50 Å to 600 Å.

The recesses 310 are then filled with a second semiconductor material 312 with a different natural lattice constant rather than that of the first semiconductor material of the substrate 300 through an epitaxy process (not shown) such as chemical vapor deposition, ultra-high vacuum chemical vapor deposition (UHV-CVD), or molecular beam epitaxy. The second semiconductor material can be elemental, alloy or compound semiconductor and is preferably an alloy semiconductor material including silicon and germanium, silicon and carbon or the combination of silicon, germanium and carbon.

Thus, a lattice-mismatched zone 314 is formed in each recess 310 and has outer and inner sides corresponding to the first gate stack G. The inner side thereof entirely and laterally contacts the substrate 300 below one side of the gate dielectric layer 304.

Figure 4C:
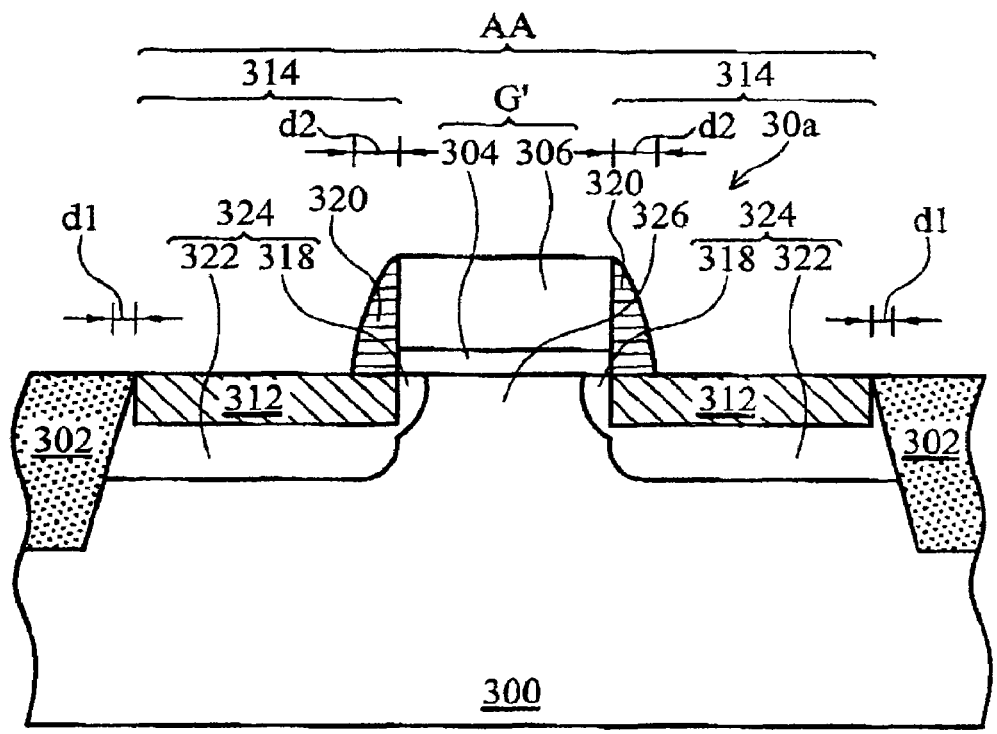

Next, as shown in FIG. 4c, after removal of the mask layer 308, a second gate stack G' remains on the substrate 300 in the active area AA. A source/drain extension region 318, a spacer 320 and a deeper source/drain region 322 are then respectively formed in a portion of the silicon substrate 300 below the second gate stack G', on sidewalls of the second gate stack G' and in the substrate 300 adjacent to the second gate stack G' to form a strained-channel transistor 30a through conventional fabrication processes for forming source/drain regions and spacers. The source/drain extension region 318 and the deeper source/drain region 322 comprise a source/drain region 324 with a lattice-mismatched zone 314 functioning as a stressor of exerting strain on the adjacent channel region and a strained-channel region 326 is thus formed in the substrate 300 and between the source/drain regions 324.

It should be noted that the active area AA shown in FIG. 4c is defined by two isolation regions 302 and each isolation region 302 is typically a tapered shape isolation structure with a sloped sidewall having an angle of 80 to 90° respective to the horizontal. To simplify filling the recess with isolation material the angle typically is not 90°. Thus, each outer side of the lattice-mismatched zones 314 are spaced substantially apart from the adjacent isolation region 302 by the first semiconductor material of the substrate 300 and laterally contacts the upper corner of one sloped sidewall of the adjacent isolation region 302, with an average distance d1 more than 50 Å therebetween, so the strain exerted on the strained-channel region 326 exerted by each stressor (referring to the lattice-mismatched zone) is not easily reduced by the isolation region 302 and the strain on the strained-channel region 326 is optimized.

Figure 4D:
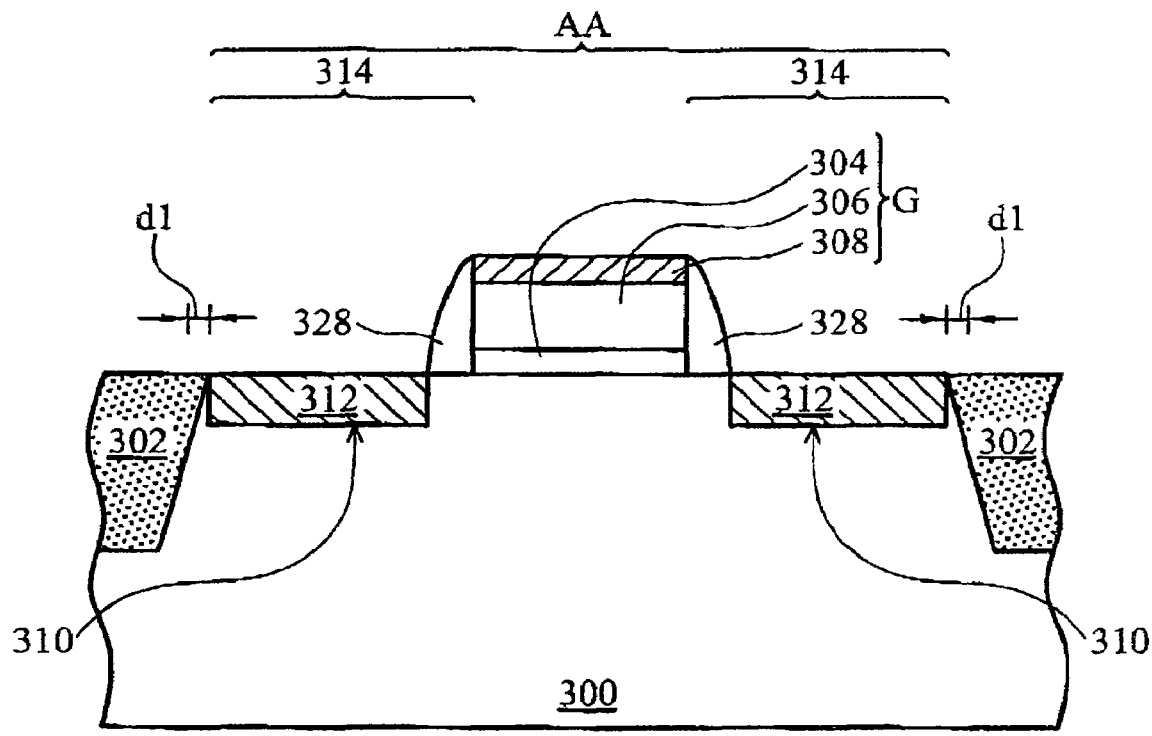

Moreover, before the etching step for forming the recess 310 illustrated in FIG. 4b, a protective spacer 328 can be optionally formed on sidewalls of the first gate stack G through the sequential deposition and etching of a protective layer (not shown) comprising silicon dioxide, for example. A lattice-mismatched zone 314 with a displacement d2 between the inner side thereof and the substrate 300 below one side of the first gate stack G can thus be formed in subsequent processes and the structure thereof is shown in FIG. 4d. The displacement d2 can be appropriately adjusted by changing the width of the protective spacer 328 preferably by less than 700 Å.

Figure 4E:
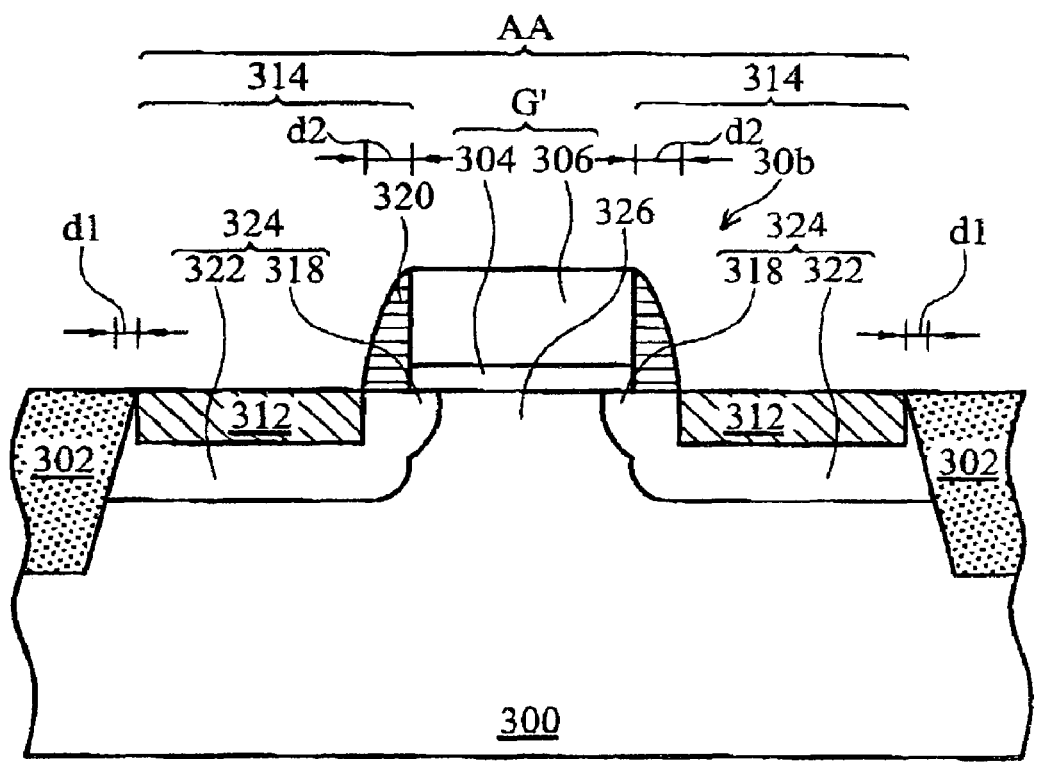

After removal of the protective spacers 328 shown in FIG. 4d, a strained-channel transistor 30b with displaced lattice-mismatched zones 314 can thus be formed in subsequent processes illustrated in FIG. 4c while the structure thereof is shown in FIG. 4e.

Figure 4F:
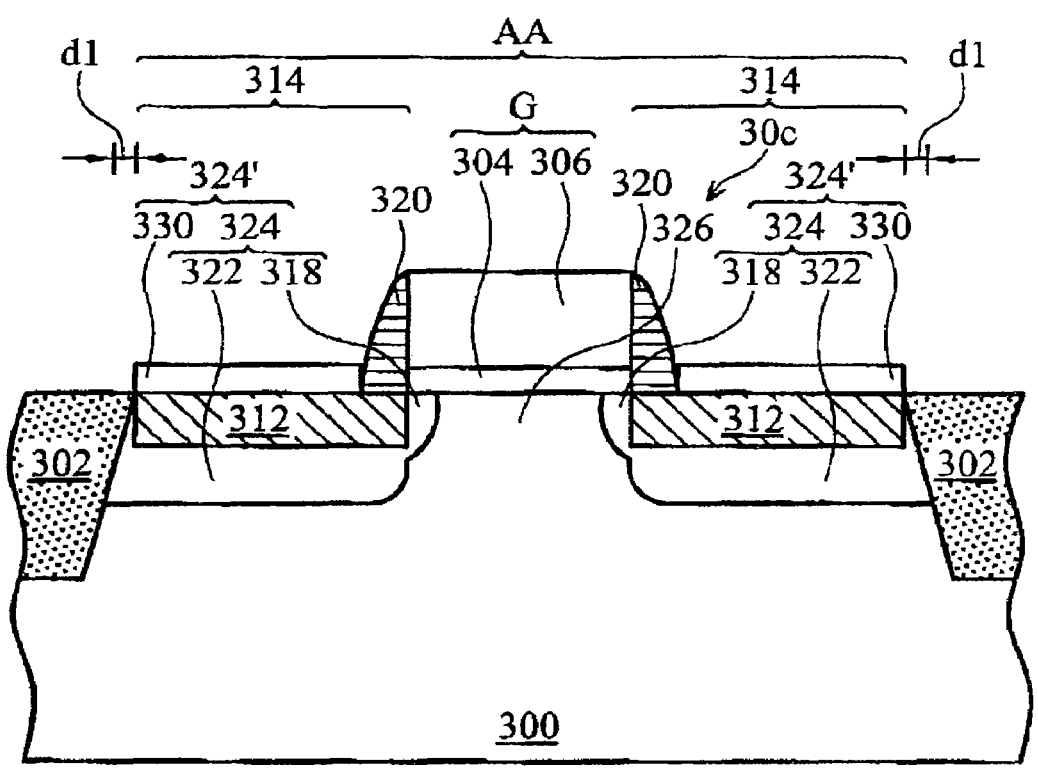

In addition, before the formation of the deeper source/drain regions 322 illustrated in FIG. 4c, an epitaxy process (not shown) can be optionally performed to selectively form a cap layer 330 on the exposed surface of the lattice-mismatched zone 314. Thickness of the cap layer 330 is about 100 Å to 400 Å above the gate dielectric layer 304 and material thereof can be the first semiconductor material of the substrate 300 such as the elemental semiconductor material silicon, or the same material of the second semiconductor material 312 such as the alloy semiconductor material. The deeper source/drains 322 are then formed and finally the source/drain regions 324 are formed. At this point, the structure of the strained-channel transistor 30c with cap layer 330 on the lattice-mismatched zones 312 is achieved as shown in FIG. 4f. The cap layer 330 can also function as a raised portion of each source/drain region 324' to form the so-called raised source/drain structure.

Figure 4G:
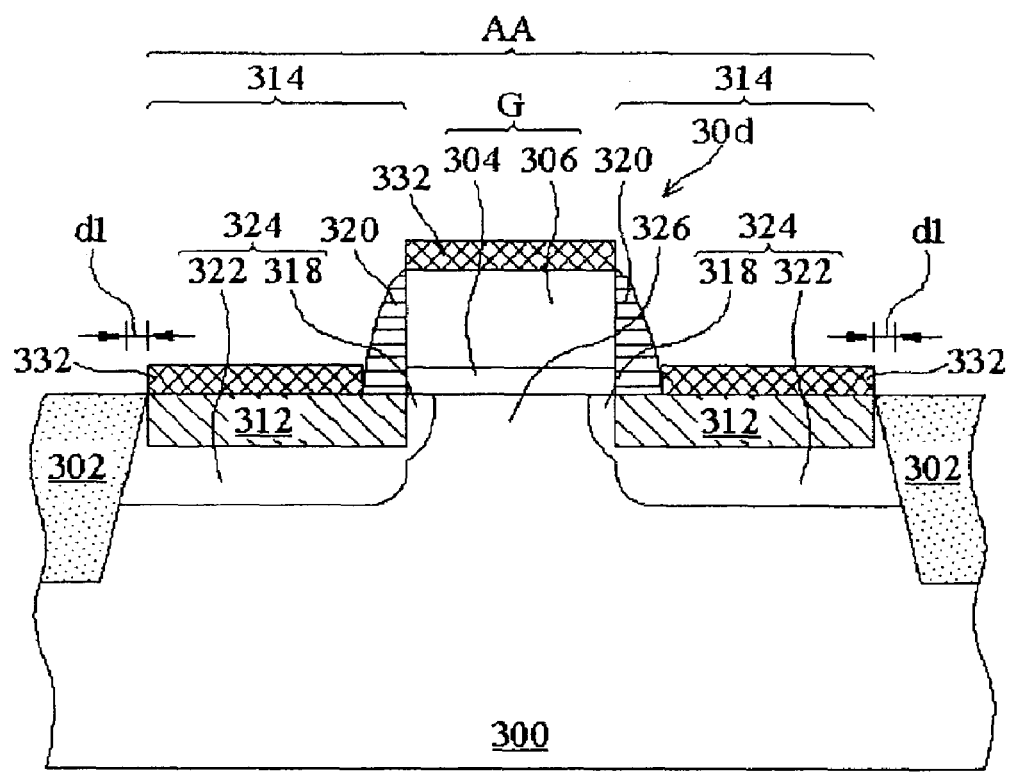

Further, a conductive layer 332 such as metal, metal silicide, or combinations thereof is optionally formed on the surface of source/drain regions 324 shown in FIG. 4c or is the cap layer 330 shown in FIG. 4f (not shown), and the gate electrode 306 is formed by the so-called self aligned silicide (salicide) process to reduce the sheet resistance of the source/drain regions 324 and the gate electrode 306. FIG. 4g shows the structure of the formed strained-channel transistor 30d having a conductive layer on the lattice-mismatched region 314. The conductive layer 332 can also be formed on the cap layers 330 even it has raised source/drain regions in FIG. 4c but they are not shown here for the sake of simplicity and will be apparent to those skilled in this art.

Figure 1A:
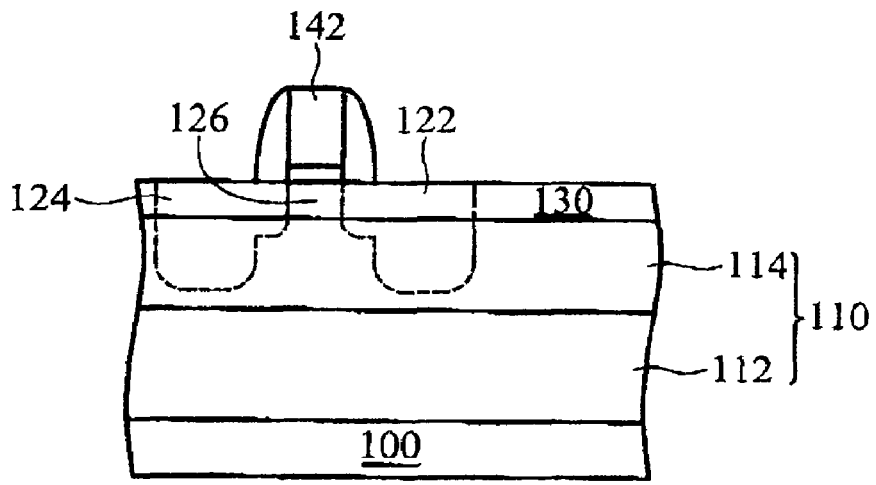
FIGS. 1A through 1C are cross sections illustrating a conventional strained silicon transistor with a relaxed SiGe layer as a stressor to induce strain in the top epitaxially strained silicon layer.
Figure 1B:
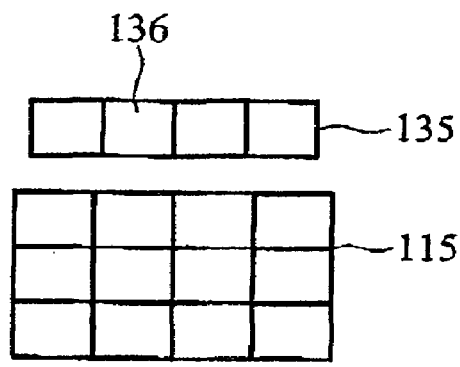
Figure 1C:
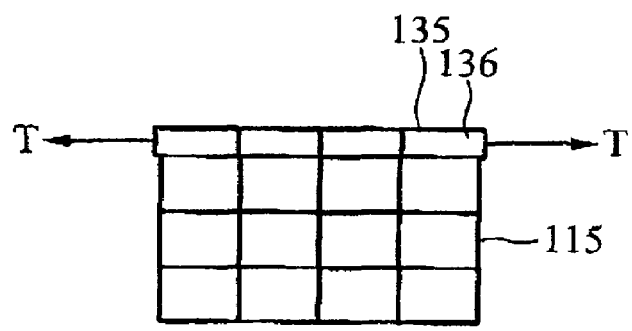
Figure 2:
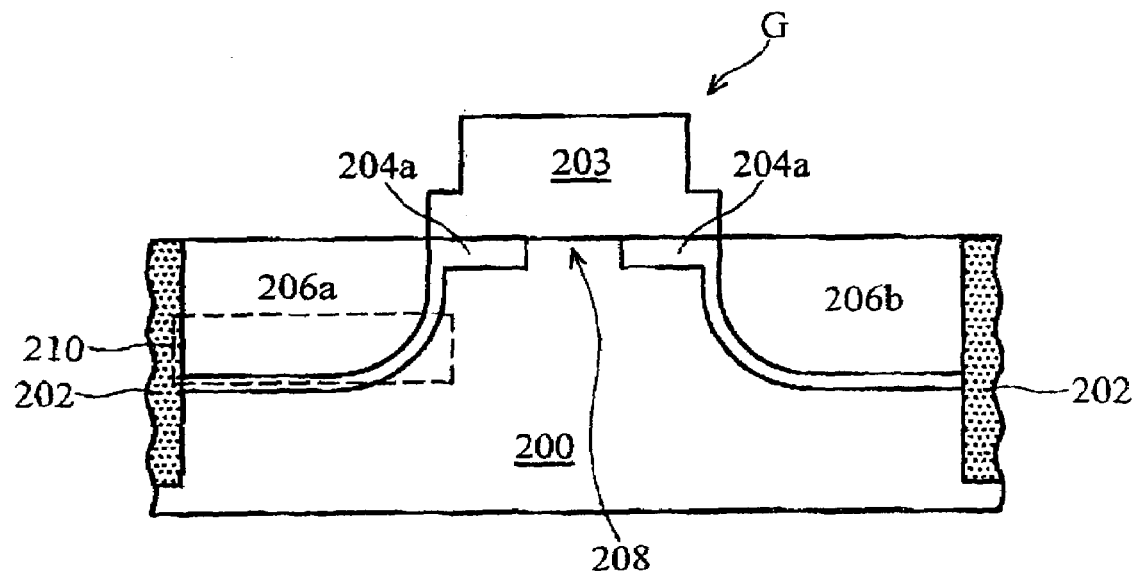
FIG. 2 is a cross section illustrating another conventional strained silicon transistor introducing strain in the channel.
Figure 3:
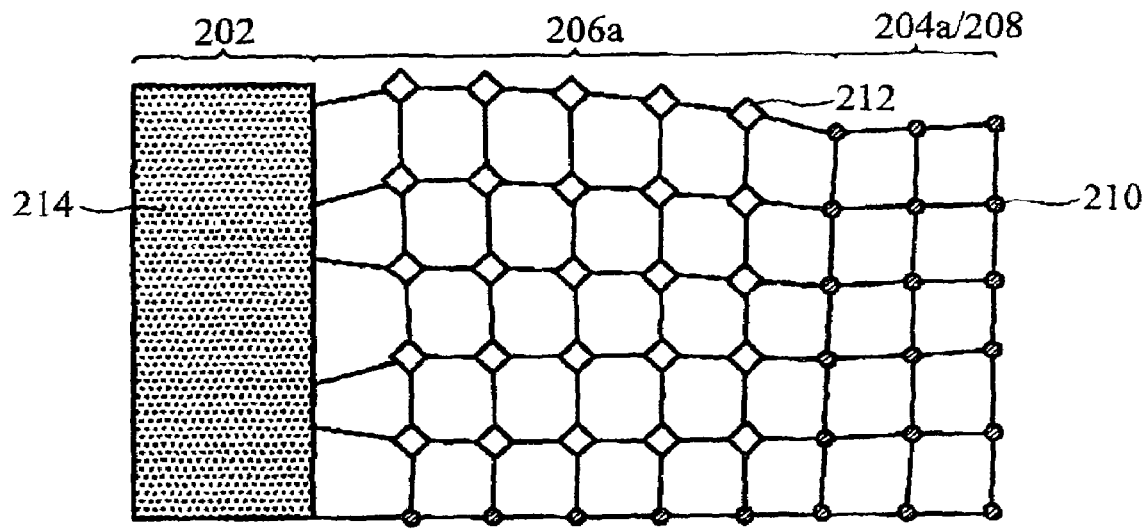
FIG. 3 is an enlargement of the photon area 210 in FIG. 2.
Figure 4H:
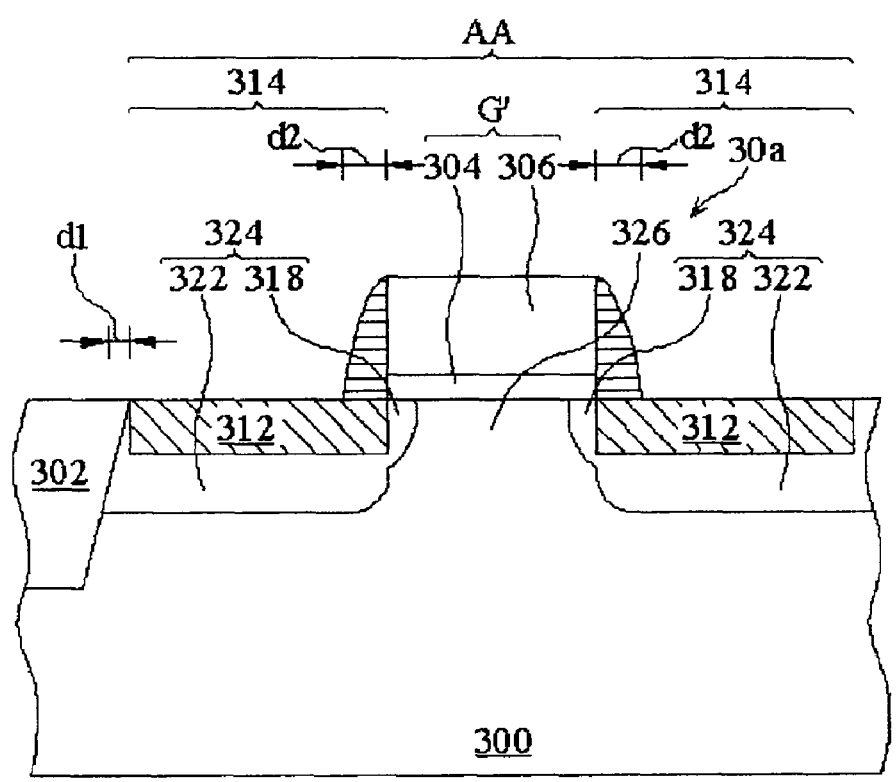

The strained-channel transistor 30a as shown in FIG. 3c can also be formed in an active area AA defined by one isolation region 302 through the described fabrication methods and the structure thereof is shown in FIG. 4h. Other methods for forming the described strained-channel transistor with displaced lattice-mismatched zones, raised source/drain regions or source/drain regions and gate electrodes with resistance reduction can be applied respectively or in combination to form different possible strained-channel transistors and is not restricted to the strained-channel transistor shown in FIG. 4h.

Thus, a strained-channel semiconductor structure having the strained-channel transistor 30a, 30b, 30c or 30d including a strained-channel region 326 between two lattice-mismatched zones therein are respectively shown in FIGS. 4c, 4e, 4f and 4g. The strained-channel semiconductor structure with the strained-channel transistor 30a as shown in FIG. 4c comprises a substrate 300 composed of a first semiconductor material. A strained-channel region 326 is disposed in the substrate 300. A gate stack (referring to the second gate stack G') is disposed over the strained channel region 326, comprising a gate dielectric layer 304 and a gate electrode 306 sequentially stacked thereon. A pair of source/drain regions (referring to the source/drain regions 324 or the raised source/drain regions 324') oppositely disposed in the substrate 300 and/or portions of the substrate 300 adjacent to the strained-channel region 326, wherein each of the source/drain regions comprises a lattice-mismatched zone 314 composed of a second semiconductor material rather than the first semiconductor material of the substrate 300, an inner side and an outer side corresponding to the second gate stack G', and at least one outer sides laterally contacts the first semiconductor material of the substrate 300.

Moreover, the lattice-mismatched zones 314 of the described semiconductor structures can be slightly displaced and applications of displaced lattice-mismatched zones, raised source/drain region, resistance reduction by a salicide process can be applied respectively or in combination and different variations of the strained-channel semiconductor structure can thus be formed.

In the strained-channel semiconductor structures in accordance with the present invention shown in FIGS. 4c, 4e, 4f and 4g, the substrate 300 preferably comprises silicon, with a natural lattice constant of approximately 5.431 Å, and the lattice-mismatched zone 314 preferably comprises an alloy semiconductor material such as a silicon-germanium (SiGe) alloy, with a natural lattice constant between about 5.431 Å to 5.657 Å depending on concentration of germanium in the silicon-germanium alloy, greater than that of substrate 300. The molar fraction of germanium in the silicon-germanium alloy of lattice-mismatched zone 314 is preferably between about 0.1 and 0.9. Therefore, the lattice-mismatched zone 314 functions as a stressor and exerts a compressive stress (not shown) in a lateral source/drain direction and tensile stress (not shown) in a vertical direction in the substrate 300 of the strained-channel region 326, resulting in strained channel region 326 under a compressive strain in the source/drain direction and tensile strain in the vertical direction. Hole mobility in the strained-channel region 326 is significantly enhanced, enhancing the drive current when the strained-channel transistor 30a, 30b, 30c and 30d in accordance with the present invention form a P-channel transistor structure. Furthermore, lattice-mismatched zone 314 can further comprise carbon as a silicon-germanium-carbon alloy, in which the molar fraction of carbon is more than 0.001.

Further, the substrate 300 preferably comprises silicon and the lattice-mismatched zone 314 preferably comprises an alloy semiconductor material such as a silicon-carbon (SiC) alloy, with a natural lattice constant smaller than that of substrate 300. The molar fraction of carbon in the silicon-carbon alloy of lattice-mismatched zone 314 is preferably between about 0.01 and 0.04. Therefore, the lattice-mismatched zone 314 functions as a stressor and exerts a tensile stress (not shown) in a lateral source/drain direction and compressive stress (not shown) in a vertical direction on the strained-channel region 326, resulting in strained-channel region 326 under a tensile strain in the lateral source/drain direction and compressive strain in the vertical direction. Electron mobility in the strained-channel region 326 is significantly enhanced; enhancing the drive current when the strained-channel transistor has an N-channel transistor structure. Furthermore, lattice-mismatched zone 314 can further comprise germanium as a silicon-carbon-germanium alloy, in which the molar fraction of germanium is more than 0.05.

Further, compressive strain and tensile strain on the strained-channel region 326 in FIGS. 4c, 4d, 4f, and 4g are about 0.1% to 4%, and preferably about 1% to 4%. Both lattice-mismatched zones 314 in FIGS. 4d and 4e are about 50 Å and 2000 Å thick, preferably about 50 Å to 600 Å. Compressive strain and tensile strain on the strained-channel region 326 in FIGS. 4c, 4d, 4f, and 4g are dependent on lattice constants of the lattice-mismatched zones 314, the thicknesses of the lattice-mismatched zones 314, and the arrangement of the lattice-mismatched zones 314 in the source/drain regions.

Moreover, the substrate 300 is N-type doped when the strained-channel transistor in FIGS. 4c, 4e, 4f and 4g. are P-channel MOS transistors, or P-type doped when the strained-channel transistor has an N-channel MOS transistor structure.

Second Embodiment

The method of fabricating the strained-channel semiconductor structure illustrated in FIGS. 4a through 4h of the first embodiment of the present invention can also be applied to the application of forming a transistor array having a plurality of strained-channel transistors on a substrate.

Figure 5A:
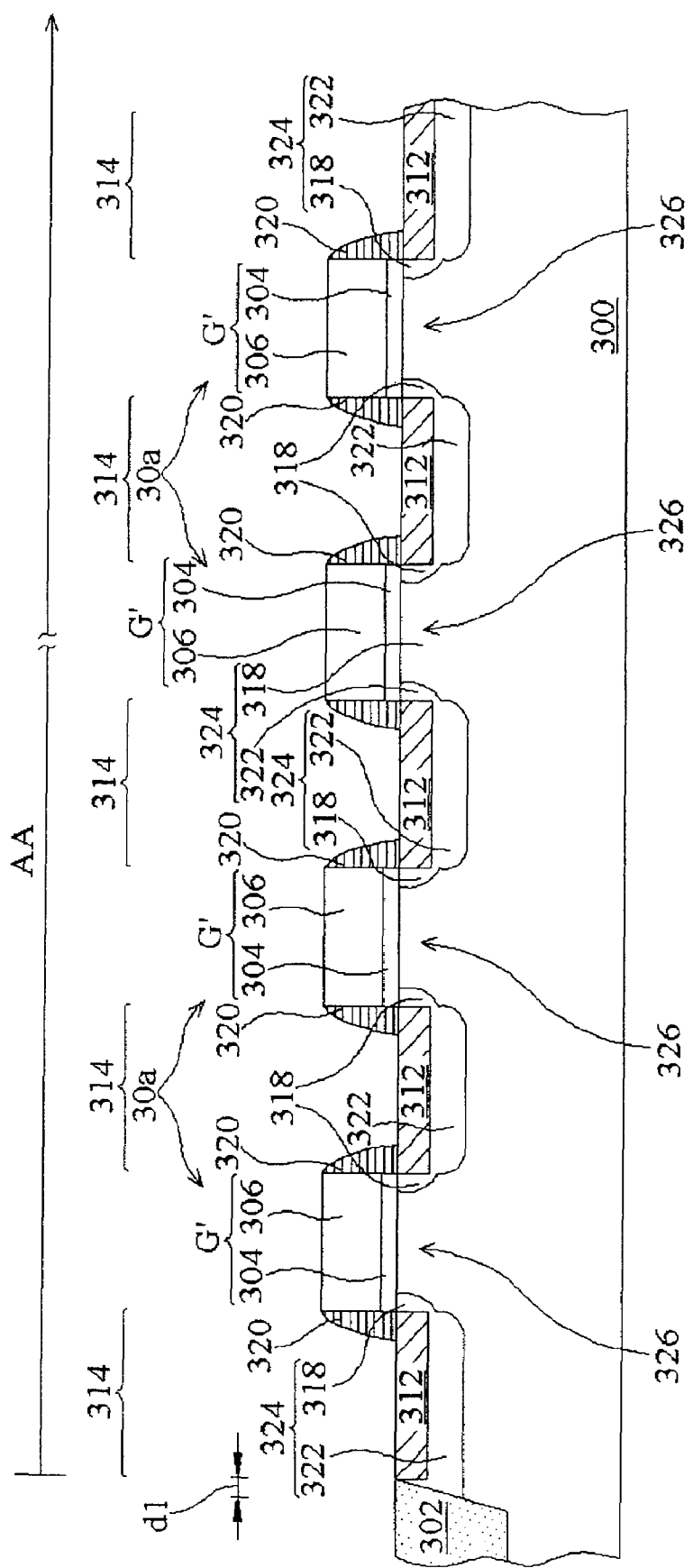
FIGS. 5a and 5b are cross sections illustrating strained-channel semiconductor structures in accordance with the second embodiment of the present invention.
Figure 5B:
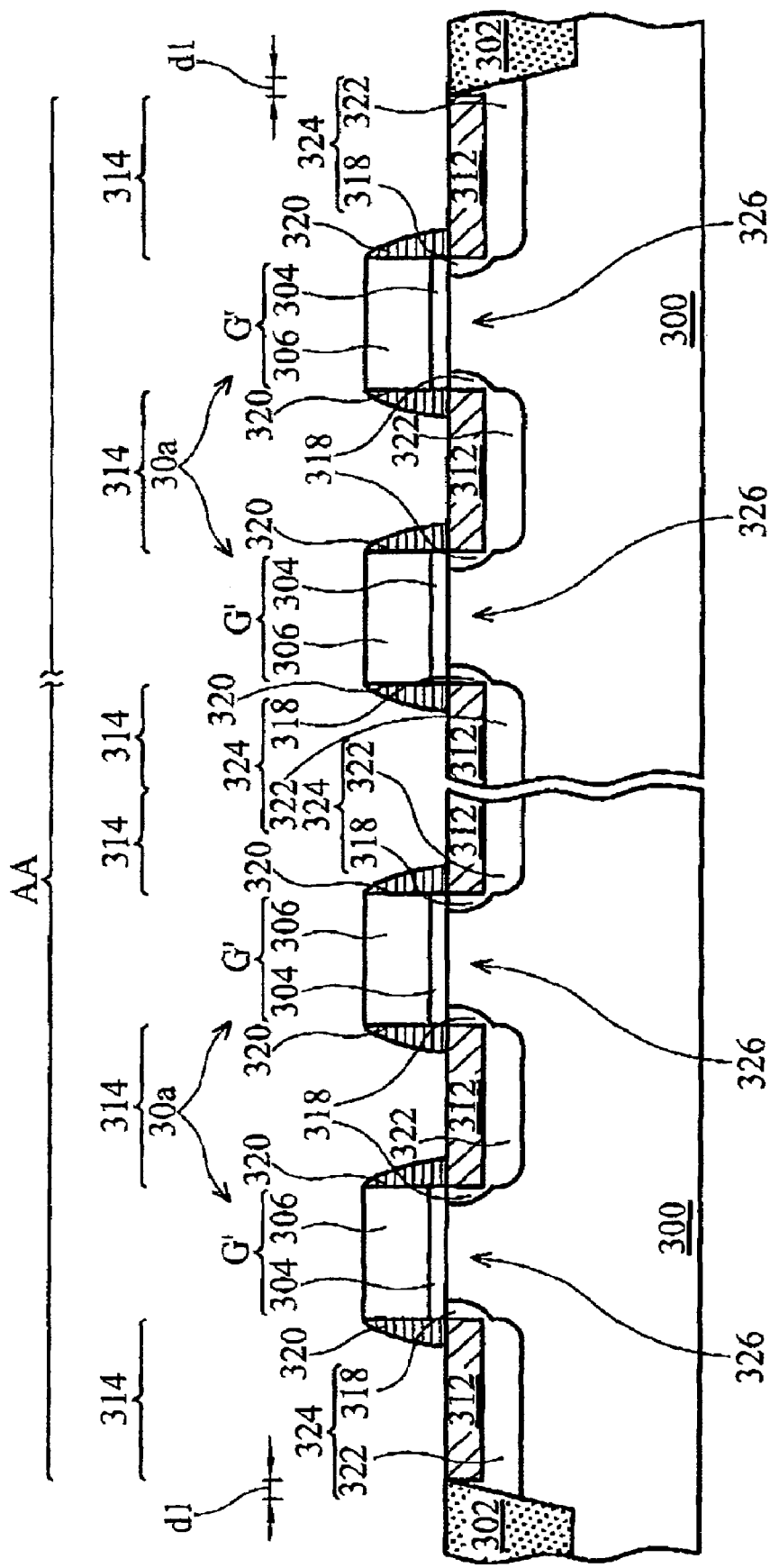

Structures of the strained-channel semiconductor structure having a transistor array thereon are shown in FIGS. 5a and 5b to respectively illustrate a strained-channel transistor array formed over an active area AA defined by one or two isolation regions 302 in the substrate 300. Each transistor formed in the active area AA is illustrated as the strained-channel transistor 30a shown in FIG. 4c, for example. The gate structures (referring to the second gate structures G') and adjacent source/drain regions 324 comprising the lattice-mismatched zone 314 are alternatively disposed on and in the substrate 300, forming a transistor array connected to functional circuits such as NOR circuits or NAND circuits.

In the strained-channel semiconductor structures of this embodiment, the lattice-mismatched zone in the source/drain regions 324 on one or each end of the gate array has an outer side corresponding to the adjacent gate structure and the outer side thereof can be spaced substantially apart from the adjacent isolation region 302 by the first semiconductor material of the substrate 300 and laterally contacts the upper corner of one sloped sidewall of the adjacent isolation region 302, with an average distance d1 of more than 50 Å therebetween, so the strain exerted on the strained-channel region 326 by the stressor (referring to the lattice-mismatched zone 314 on one or each end) is not easily reduced by the adjacent isolation region 302 and the strain on the strained-channel region 326 can be optimized.

Moreover, the lattice-mismatched zones 314 illustrated in FIG. 5a and FIG. 5b can be slightly displaced and applications of displaced lattice-mismatched zones, raised source/drain region, resistance reduction by a salicide process can be applied respectively or in combination and different variations of the strained-channel semiconductor structure can thus be formed and are not limited to the strained-channel semiconductor structure illustrated in FIGS. 5a and 5b.

Third Embodiment

Another method of fabricating the strained-channel semiconductor structure of the invention is illustrated in FIGS. 6a to 6h.

Figure 6A:
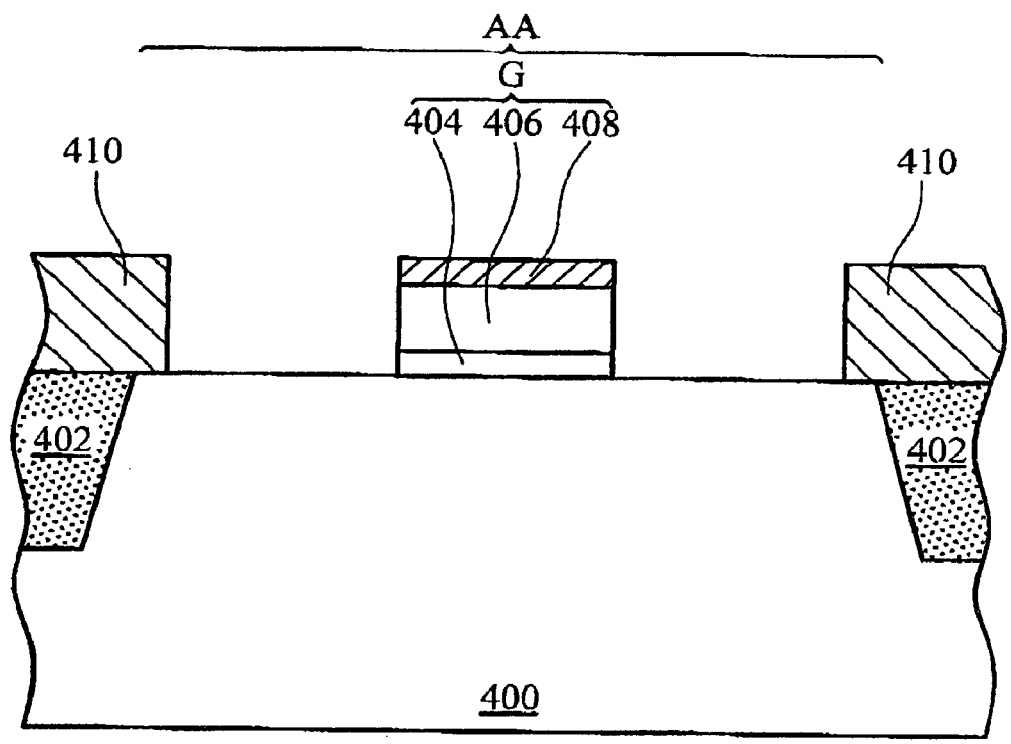
FIGS. 6a through 6h are cross sections illustrating strained-channel semiconductor structures in accordance with the third embodiment of the present invention.

In FIG. 6a, a substrate 400 of first semiconductor material is provided. The substrate 400 may comprise a plurality of active areas (not shown) for forming devices thereon defined by a plurality of isolation structures (not shown) formed in the substrate 400. The active area AA defined by the two adjacent isolation regions 402 is shown in FIG. 6a to simplify the description. The first semiconductor material of the substrate 400 can be elemental, alloy or compound semiconductor material and is preferably an elemental semiconductor material such as silicon. The isolation region 402 can be, for example, a conventional shallow trench isolation (STI) region.

Next, a first gate stack G including a gate dielectric layer 404, a gate electrode layer 406, and a mask layer 408 sequentially stacked over a portion of the substrate 400 is formed in the active area AA. The gate dielectric layer 404 can be formed by thermal oxidation, thermal oxidation followed by nitridation, chemical vapor deposition, physical vapor deposition such as sputtering, or other known techniques to form a gate dielectric layer. The Gate dielectric layer 404 can be silicon dioxide, silicon nitride, silicon oxynitride, or combinations thereof with a thickness from about 3 Å to 100 Å, preferably approximately 10 Å or less. The gate dielectric layer 404 can also be a high permittivity (high-k) material with a relative permittivity greater than 8 such as aluminum oxide ($Al_2O_3$), hafnium oxide ($HfO_2$), zirconium oxide ($ZrO_2$), hafnium oxynitride (HfON), hafnium silicate ($HfSiO_4$), zirconium silicate ($ZrSiO_4$), lanthanum oxide ($La_2O_3$), or combinations thereof with an equivalent oxide thickness from about 3 Å to 10 Å. The gate electrode 406 can be polycrystalline-silicon (poly-Si), polycrystalline silicon-germanium (poly-SiGe), refractory metal such as molybdenum or tungsten, compounds such as titanium nitride, combinations thereof, or another conductive material. In addition, implants known as workfunction implants can be introduced in the gate electrode 406 to alter the workfunction thereof. The mask layer 408 can be silicon nitride or silicon dioxide formed by chemical vapor deposition (CVD). Two mask patterns 410 are then respectively formed on the substrate 400 and each thereof is substantially disposed on each isolation region 402 and covers a portion of the substrate 400 adjacent to the isolation region 402.

The gate stack G is formed by sequentially forming a dielectric layer (not shown), a gate electrode material layer (not shown) and a mask material layer (not shown) over the substrate 400. Then the mask material layer is patterned to form a mask layer 408 for defining gate electrode 406 and the gate electrode material layer and the dielectric layer are subsequently etched using the mask layer 408 as an etching mask to form the gate electrode 406 and the gate dielectric layer 404 and finally leaves the mask layer 408 thereon. Thus, the gate electrode 406 is electrically isolated from the channel region by the gate dielectric layer 404. The gate dielectric layer 404 is preferably silicon oxynitride and gate electrode 406 is preferably poly-silicon etched using chlorine and bromine with a high etching selectivity respective to the gate dielectric later 404 when the substrate 400 comprises silicon material. The mask patterns 410 are formed by sequentially depositing and patterning of a second mask layer (not shown) and material thereof can be a photoresist material, silicon dioxide, or silicon nitride.

Figure 6B:
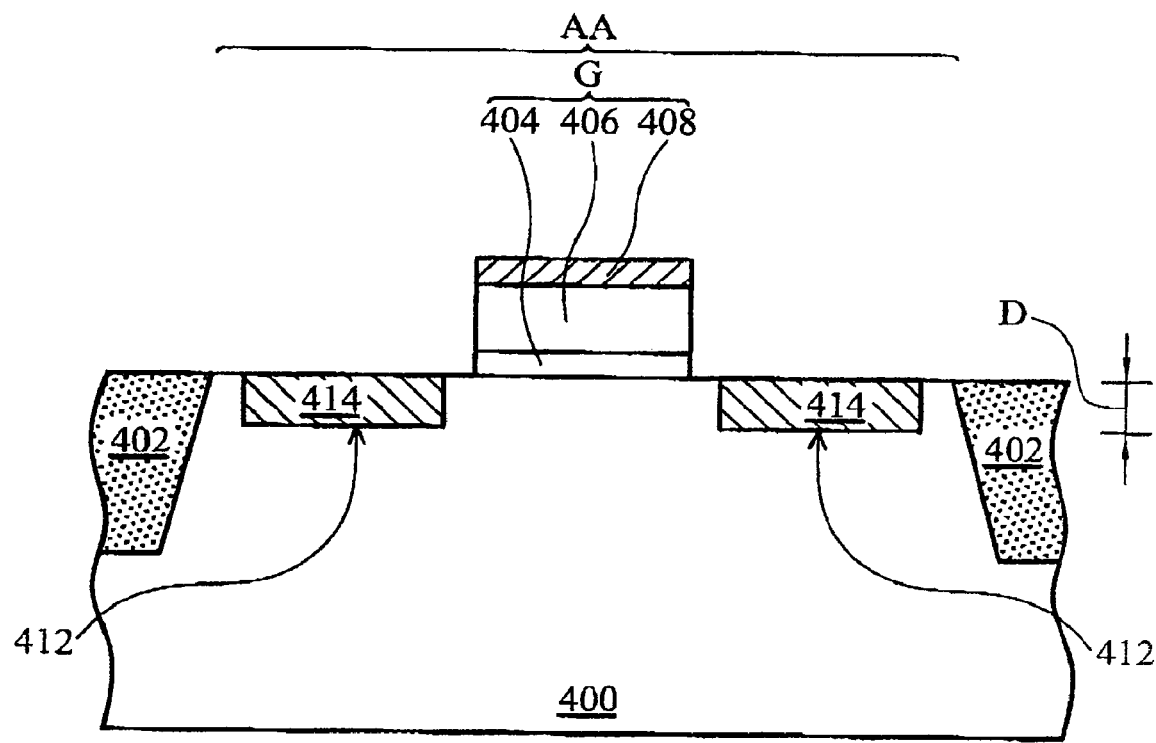

In FIG. 6b, an etching step (not shown), for example a plasma dry etching, is performed to etch the substrate 400 in the active area AA exposed by the first gate stack G and the mask patterns 410. Thus, recesses 412 with a depth D are then opposingly formed in the substrate 400 adjacent to the first gate stack G. The depth D of each recess 412 can range from 50 Å to 2000 Å and preferably from 50 Å to 600 Å.

Then, the recess 412 is filled with a second semiconductor material 414 having a different natural lattice constant rather than that of the first semiconductor material of the substrate 400 through an epitaxy process (not shown) such as chemical vapor deposition, ultra-high vacuum chemical vapor deposition (UHV-CVD), or molecular beam epitaxy. The second semiconductor material can be elemental, alloy or compound semiconductor material and is preferably an alloy semiconductor material including silicon and germanium, silicon and carbon or the combination of silicon, germanium and carbon.

Thus, a lattice-mismatched zone 416 is formed in each recess 412 and has an outer side and inner side corresponding to the first gate stack G, and the inner side thereof entirely and laterally contacts the substrate 400 below one side of the gate dielectric layer 404.

Figure 6C:
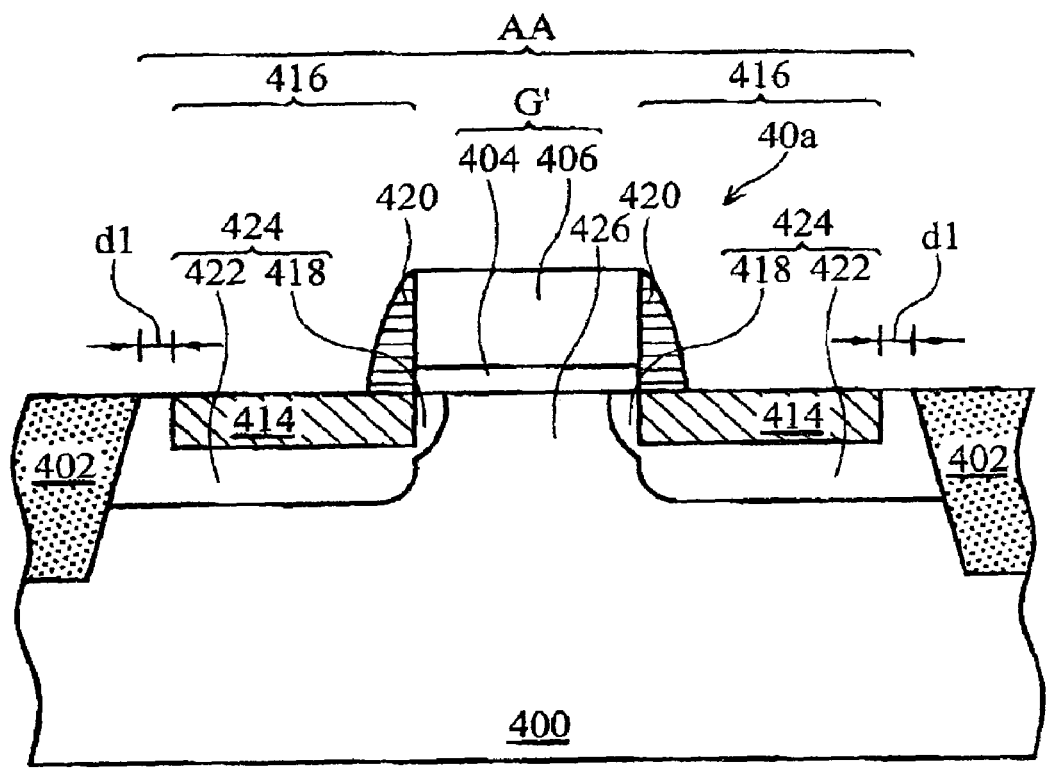

Next, as shown in FIG. 6c, after removal of the mask layer 408 and the mask patterns 410, a second gate stack G' remains over the substrate 400 in the active area AA. Then a source/drain extension region 418, a spacer 420 and a deeper source/drain region 422 are respectively formed in a portion of the silicon substrate 400 below the second gate stack G', on sidewalls of the second gate stack G' and in the substrate 400 adjacent to the second gate stack G' to form a strained-channel transistor 40a through conventional fabrication processes for forming source/drain regions and spacers. The source/drain extension region 418 and the deeper source/drain region 422 comprise a source/drain region 424 with a lattice-mismatched zone 416 acting as a stressor to exert strain on the adjacent channel region and a strained-channel region 426 is thus formed in the substrate 400 and between the source/drain regions 424.

It should be noted that the active area AA shown in FIG. 6c is defined by two isolation regions 402 and the outer side of each lattice-mismatched zones 416 is spaced entirely apart from the adjacent isolation region 402 by the first semiconductor material of the substrate 400 and laterally without contacting the adjacent isolation region 402, with a distance d1 of more than 50 Å therebetween, such that the strain on the strained-channel region 426 by each stressor (referring to the lattice-mismatched zone 416) will not be reduced by the isolation region 402 and the strain on the strained-channel region 426 is optimized.

Figure 6D:
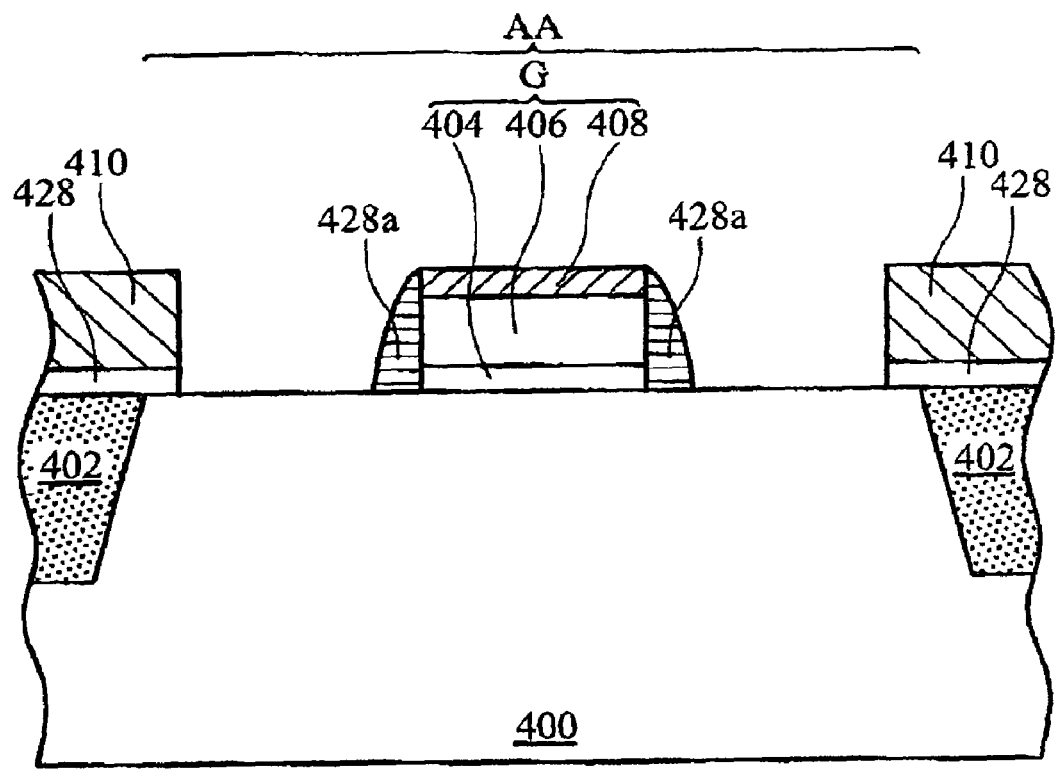

Moreover, before the formation of the mask patterns 410, a protective spacer 428a can be optionally formed on sidewalls of the first gate stack G through sequential deposition and etching of a protective layer 428. The mask patterns are respectively formed on portions of the mask layer 428 before the above described etching. The structure is illustrated in FIG. 6d. The material of the protective layer 428 can be silicon dioxide.

Figure 6E:
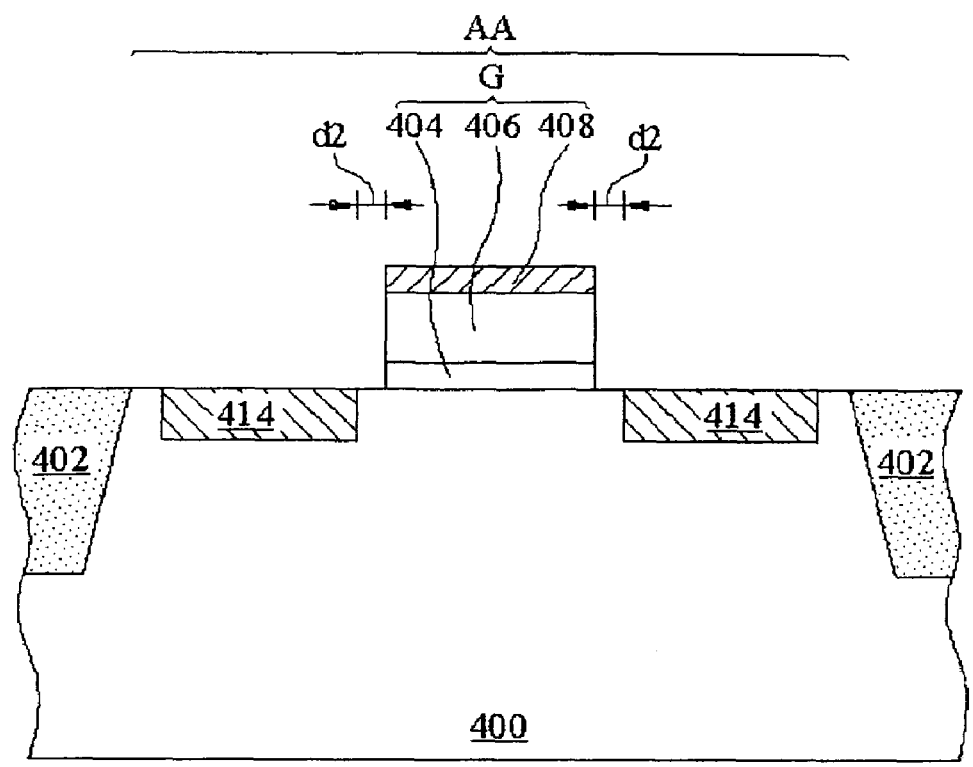

Next, the subsequent processes illustrated in FIG. 6b are then performed subsequent to removal of the protective spacers 428a and the mask patterns 410. A lattice-mismatched zone 416 with a displacement d2 between the inner side thereof and the substrate 400 below one side of the first gate stack G can thus be formed in subsequent processes and the structure thereof is shown in FIG. 6e. The displacement d2 can be appropriately adjusted by changing the width of the protective spacer 428a (not shown) and preferably is less than 700 Å.

Figure 6F:
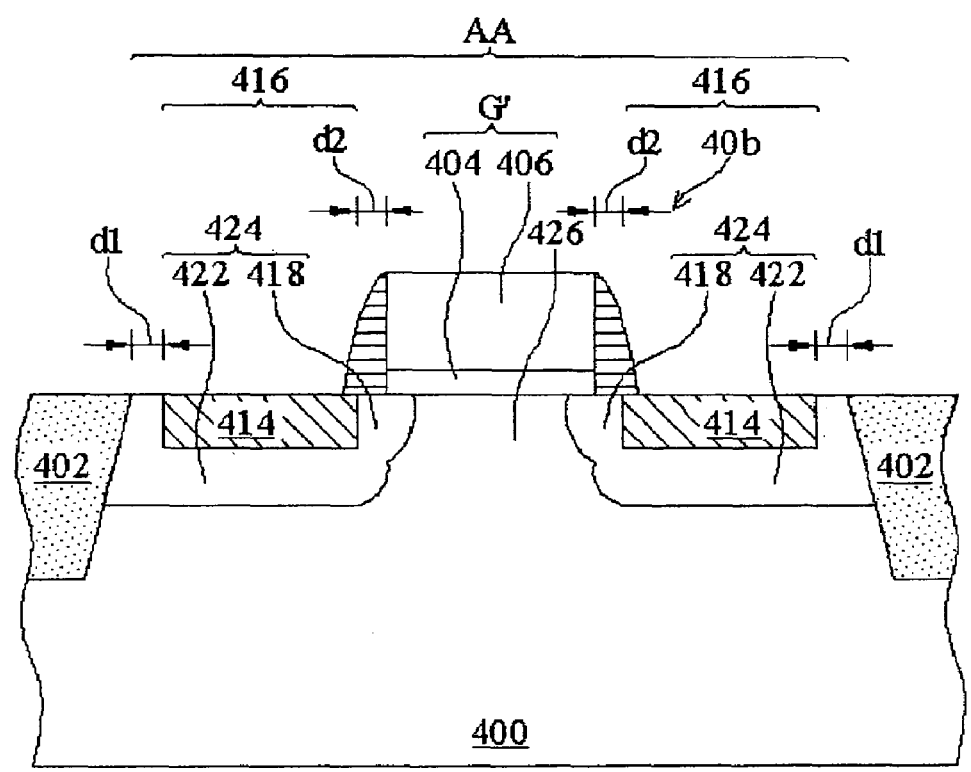

Then a strained-channel transistor 40b with displaced lattice-mismatched zones 416 can thus be formed through the subsequent processes illustrated in FIG. 6c and the structure thereof is shown in FIG. 6f.

Figure 6G:
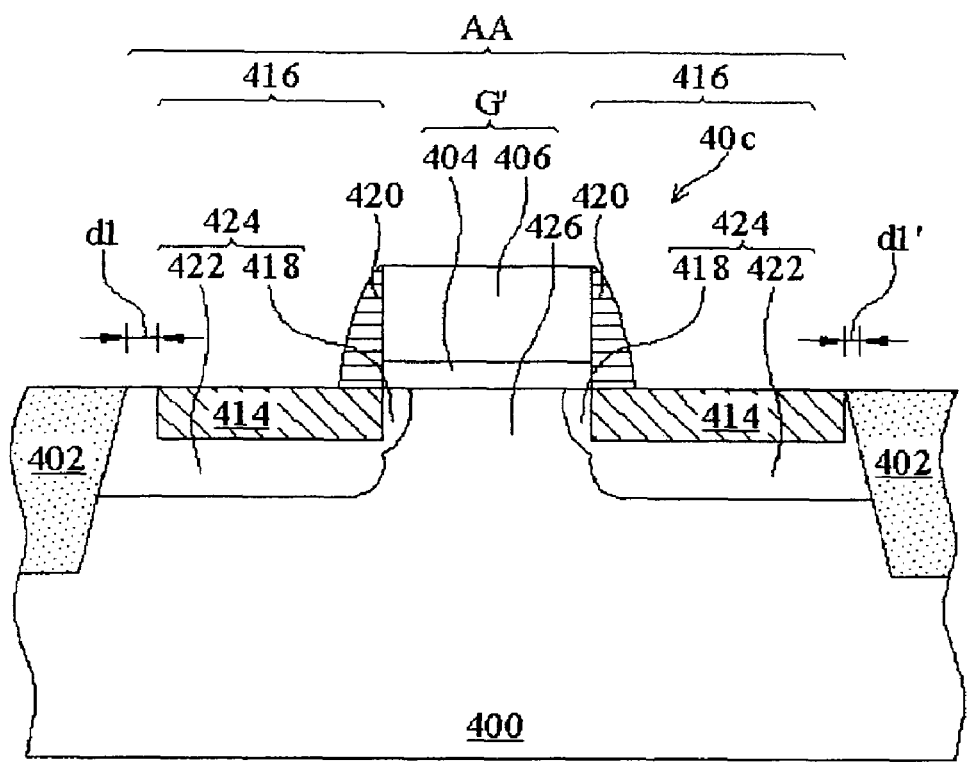

In addition, the mask pattern 410 need only be formed on one of the isolation regions 402, as shown in FIG. 6a, to cover a portion of the adjacent substrate 400. Through the fabrication processes illustrated in FIGS. 6b to 6c, a strained-channel transistor 40c with one outer side of the lattice-mismatched zones 416 is spaced substantially apart from the adjacent isolation region 402 by the first semiconductor material of the substrate 400 and laterally contacts the upper corner of the adjacent isolation region 402, with an average distance d1' of more than 50 Å therebetween, and the outer side of the other lattice-mismatched zones 416 is spaced entirely apart from the adjacent isolation region 402 by the first semiconductor material of the substrate 400 such that the strain on strained-channel region 426 exerted by each stressor (referring to the lattice-mismatched zone) is not easily reduced by the isolation region 402 and the strain on the strained-channel region 426 is optimized. The semiconductor structure including the strained-channel transistor 40c is shown in FIG. 6g.

The strained-channel transistor 40a as shown in FIG. 6c can also be formed in an active area AA defined by one isolation region 402 through the described fabrication methods. The structure of the strained-channel transistor is not illustrated, for simplicity.

Figure 6H:
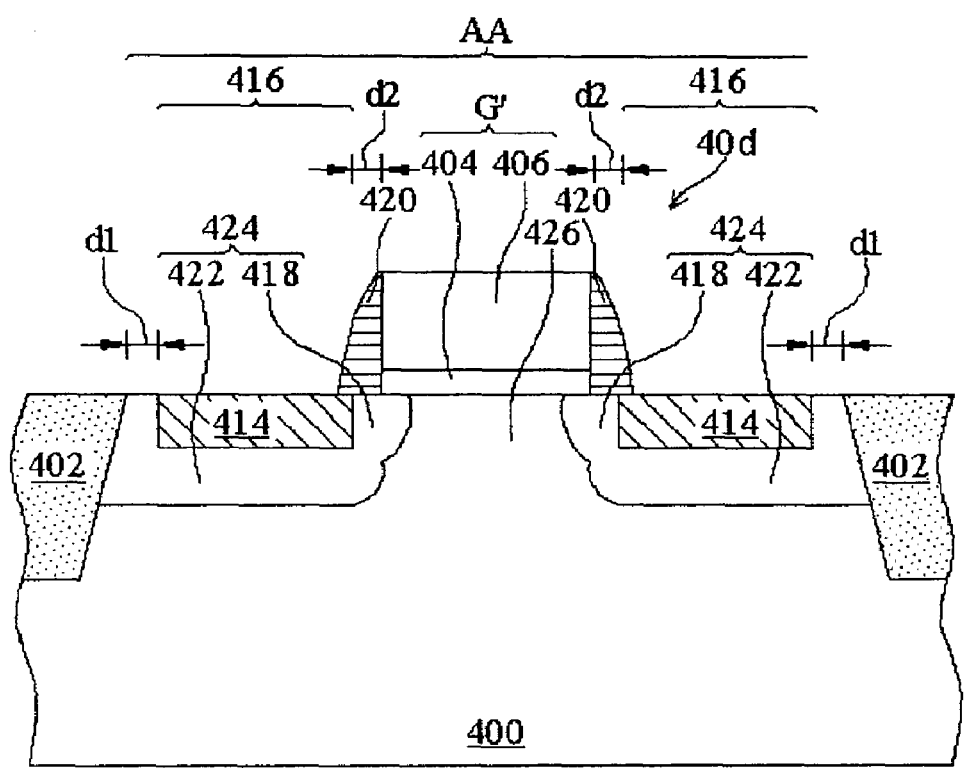

Further, through the fabrication processes illustrated in FIGS. 6b to 6c in combination with that illustrated in FIGS. 6d to 6f, a strained-channel transistor 40d with one outer side of the displaced lattice-mismatched zones 416 is spaced substantially apart from the adjacent isolation region 402 by the first semiconductor material of the substrate 400 and laterally contacts the upper corner of the adjacent isolation region 402, with an average distance d1 more than 50 Å therebetween, and the outer side of the other lattice-mismatched zones 416 is spaced entirely apart from the adjacent isolation region 402 by the first semiconductor material of the substrate 400 such that the strain on the strained-channel region 426 exerted by each stressor (referring to the lattice-mismatched zone) is not easily reduced by the isolation region 402 and the strain on the strained-channel region 426 is optimized. The semiconductor structure including the strained-channel transistor 40d is shown in FIG. 6h.

Thus, a strained-channel semiconductor structure having the strained-channel transistor 40a, 40b, 40c, or 40d including a strained-channel region 426 between two lattice-mismatched zones therein are respectively shown in FIGS. 6c, 6f, 6g and 6h. The strained-channel semiconductor structure having the strained-channel transistor 40a in FIG. 6c comprises a substrate 400 composed of a first semiconductor material. A strained-channel region 426 is disposed in the substrate 400. A gate stack (referring to the second gate stack G') is disposed over the strained channel region 426, comprising a gate dielectric layer 404 and a gate electrode 406 sequentially stacked thereon. A pair of source/drain regions (referring to the source/drain regions 424) oppositely disposed in the substrate 400 adjacent to the strained-channel region 426, wherein each of the source/drain regions comprises a lattice-mismatched zone 416 comprising a second semiconductor material rather than the first semiconductor material of the substrate 400, an inner side and an outer side corresponding to the second gate stack G', and at least one outer sides laterally contacts the first semiconductor material of the substrate 400.

Moreover, applications of displaced lattice-mismatched zones, raised source/drain region, resistance reduction by a salicide process can be applied respectively or in combination on the lattice-mismatched zones 416 of the described semiconductor structures through the processes illustrated in the first embodiment of the present invention. Thus, different variations of the strained-channel semiconductor structure can be further formed but are not illustrated here, for simplicity.

In the strained-channel semiconductor structures in accordance with the present invention shown in FIGS. 6c, 6f, 6g and 6h, the substrate 400 preferably comprises silicon, with a natural lattice constant of approximately 5.431 Å, and the lattice-mismatched zone 416 preferably comprises an alloy semiconductor material such as a silicon-germanium (SiGe) alloy, with a natural lattice constant between about 5.431 Å to 5.657 Å depending on whether the concentration of germanium in the silicon-germanium alloy is greater than that of substrate 400. The molar fraction of germanium in the silicon-germanium alloy of the lattice-mismatched zone 416 is preferably between about 0.1 and 0.9. Therefore, the lattice-mismatched zone 416 acts as a stressor and exerts a compressive stress (not shown) in a lateral source/drain direction and tensile stress (not shown) in a vertical direction in the substrate 400 of the strained-channel region 426, resulting in strained channel region 426 under a compressive strain in the source/drain direction and tensile strain in the vertical direction. Hole mobility in the strained-channel region 426 is significantly enhanced, enhancing the drive current when the strained-channel transistor 40a, 40b, 40c and 40d in accordance with the present invention is a P-channel transistor structure. Furthermore, lattice-mismatched zone 416 can further comprise carbon as a silicon-germanium-carbon alloy, in which the molar fraction of carbon is more than 0.001.

Further, the substrate 400 preferably comprises silicon and the lattice-mismatched zone 416 preferably comprises an alloy semiconductor material such as a silicon-carbon (SiC) alloy, with a natural lattice constant smaller than that of substrate 400. The molar fraction of carbon in the silicon-carbon alloy of lattice-mismatched zone 416 is preferably between about 0.01 and 0.04. Therefore, lattice-mismatched zone 416 functions as a stressor and exerts a tensile stress (not shown) in a lateral source/drain direction and compressive stress (not shown) in a vertical direction on the strained-channel region 426, resulting in strained-channel region 426 under a tensile strain in the lateral source/drain direction and compressive strain in the vertical direction. Electron mobility in the strained-channel region 426 is significantly enhanced, enhancing the drive current when the strained-channel transistor has an N-channel transistor structure. Furthermore, lattice-mismatched zone 416 can further comprise germanium as a silicon-carbon-germanium alloy, in which the molar fraction of germanium is more than 0.05.

Further, compressive strain and tensile strain on the strained-channel region 426 in FIGS. 6c, 6f, 6g, and 6h are about 0.1% to 4%, preferably about 1% to 4%. Both lattice-mismatched zone 416 in FIGS. 6c, 6f, 6g and 6h are about 50 Å and 2000 Å thick, preferably about 50 Å to 600 Å. Compressive strain and tensile strain on the strained-channel region 426 in FIGS. 6c, 6f, 6g, and 6h are dependent on lattice constants of lattice-mismatched zones 416, thicknesses of lattice-mismatched zones 416, and arrangement of lattice-mismatched zone 416 in source/drain regions.

Moreover, substrate 400 is N-type doped when the strained-channel transistor in FIGS. 6c, 6f, 6g and 6h are P-channel MOS transistors, or P-type doped when strained-channel transistor structure are N-channel MOS transistors.

Fourth Embodiment

The method of fabricating the strained-channel semiconductor structure illustrated in FIGS. 6a through 6h of the third embodiment of the present invention can also be applied to the application of forming a transistor array having a plurality of strained-channel transistors on a substrate.

Figure 7A:
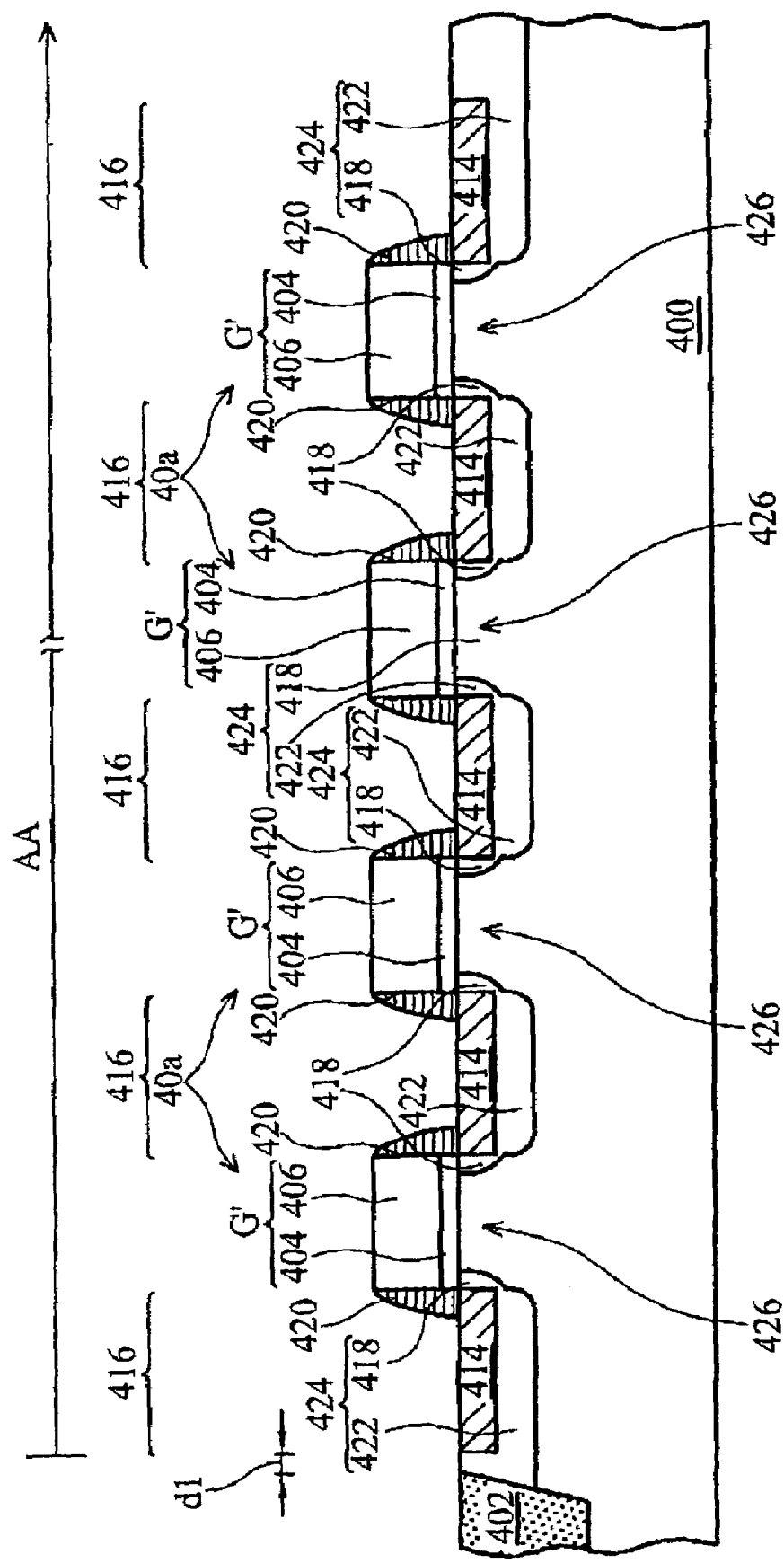
FIGS. 7a through 7c are cross sections illustrating strained-channel semiconductor structures in accordance with the fourth embodiment of the present invention.
Figure 7B:
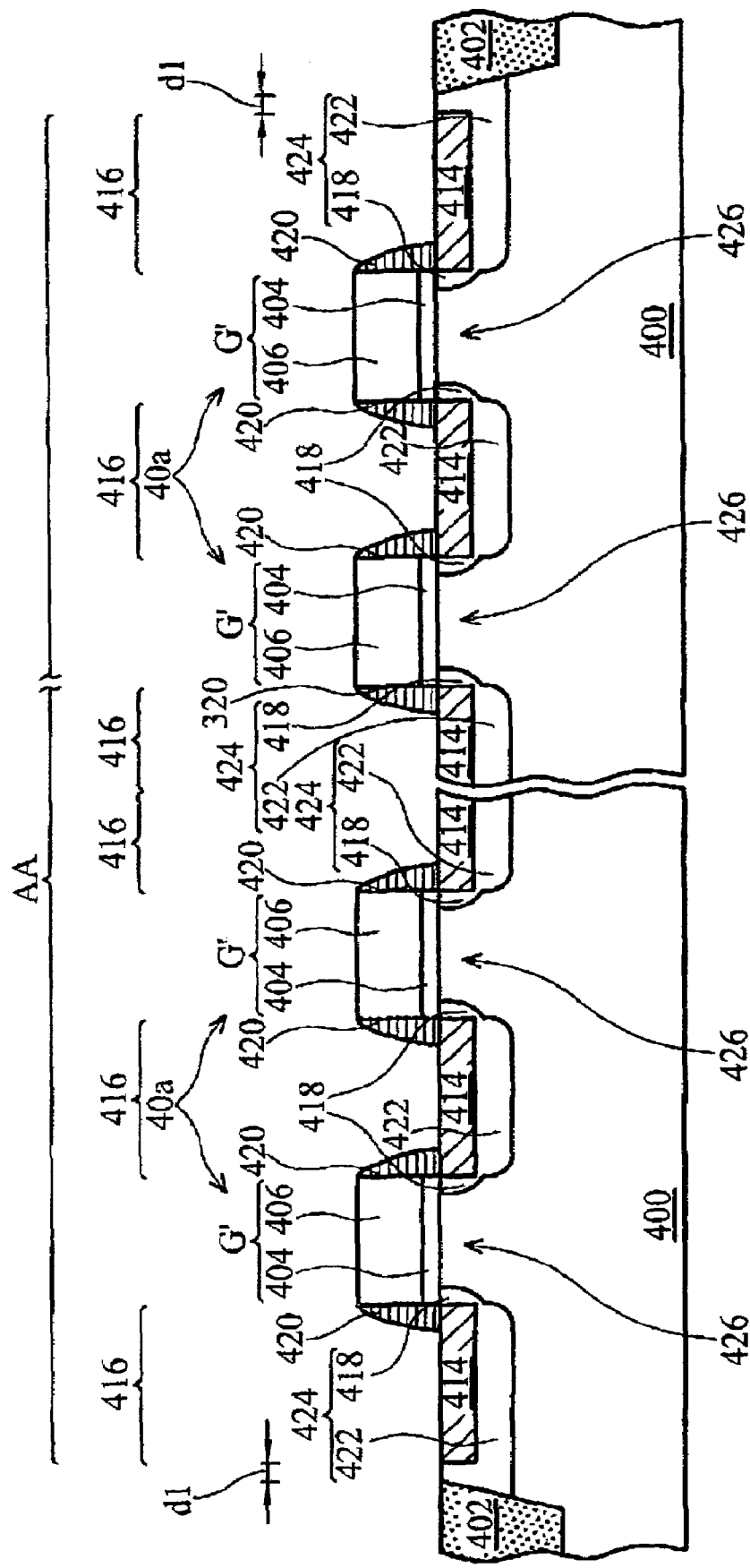
Figure 7C:
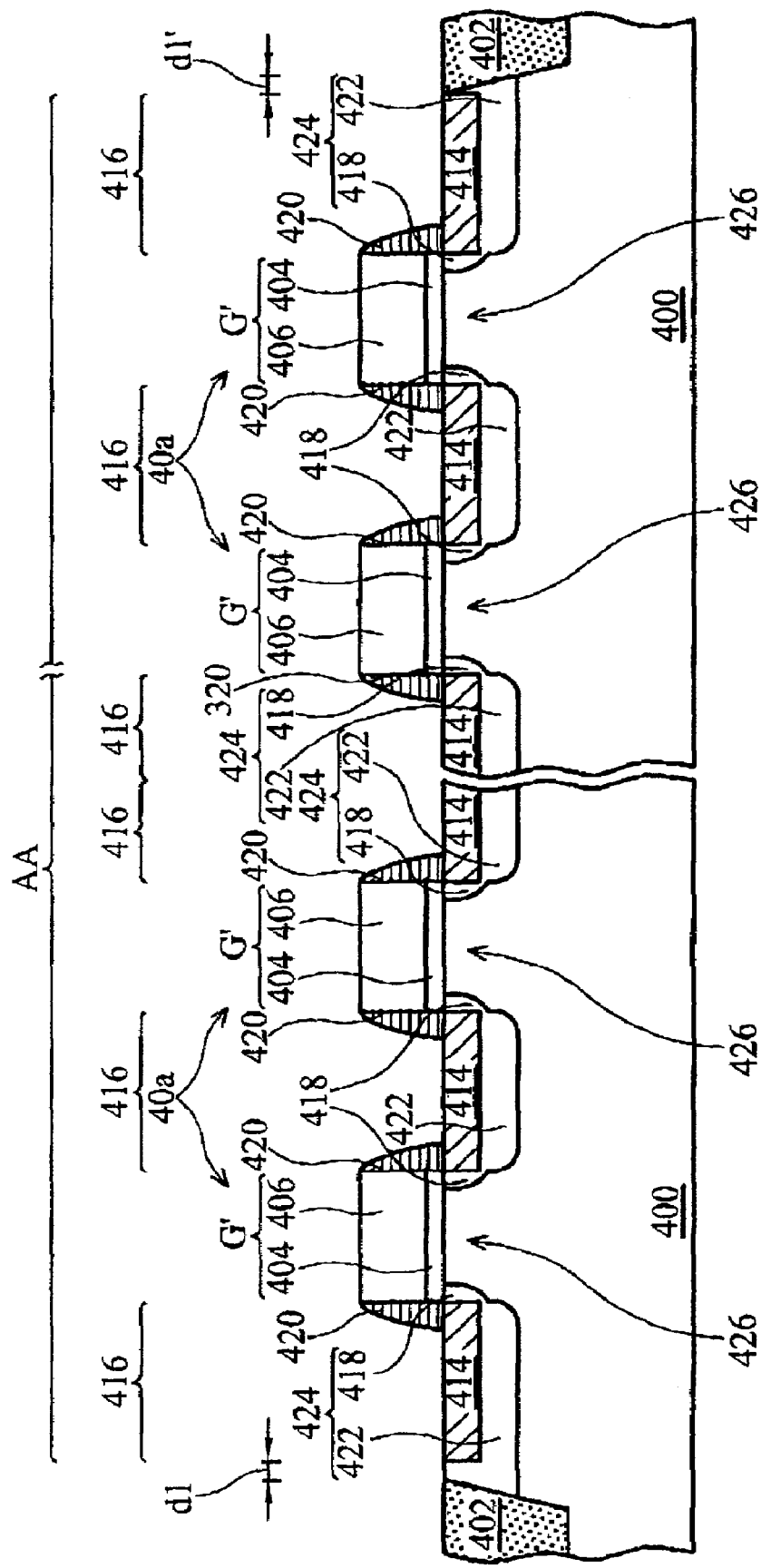

Structures of the strained-channel semiconductor structure having a transistor array thereon are shown in FIGS. 7a, 7b and 7c to respectively illustrate a strained-channel transistor array formed over an active area AA defined by one or two isolation regions 402 in the substrate 400. Each transistor formed in the active area AA here is illustrated as the strained-channel transistor 40a shown in FIG. 6c. The gate structures (referring to the second gate structures G') and adjacent source/drain regions 424 comprising the lattice-mismatched zone 416 are alternatively disposed on and in the substrate 400, forming a transistor array connected to functional circuits such as NOR circuits or NAND circuits.

In the strained-channel semiconductor structures of this embodiment, the lattice-mismatched zone 416 of the source/drain regions 424 on each end or at least one end of the transistor array has an outer side corresponding to the adjacent gate structure and the outer side thereof can be spaced entirely apart from the adjacent isolation region 402 by the first semiconductor material of the substrate 400, with a distance d1 more than 50 Å therebetween. Nevertheless, one outer side of the lattice-mismatched zone 416 of the source/drain regions 424 on one end of the transistor array can be spaced substantially apart from the adjacent isolation region 402 and laterally contacts the upper corner of one sloped sidewall of the adjacent isolation region 402, with an average distance d1' more than 50 Å therebetween. Thus, the strain on the strained-channel region 426 exerted by the stressor (referring to the lattice-mismatched zone 416 on one or both ends) is not easily reduced by the adjacent isolation region 402 and the strain thereof on the strained-channel region 426 can be optimized.

Moreover, the lattice-mismatched zones 416 illustrated in FIGS. 7a, 7b and 7c can be slightly displaced and applications of displaced lattice-mismatched zones, raised source/drain region, sheet resistance reduction by a salicide process can also be respectively applied or applied in combination and different variations of the strained-channel semiconductor structure can thus be formed and are not limited to the strained-channel semiconductor structure illustrated in FIGS. 7a, 7b and 7c.

Fifth Embodiment

Another method of fabricating the strained-channel semiconductor structure of the invention is illustrated in FIGS. 8a to 8e.

Figure 8A:
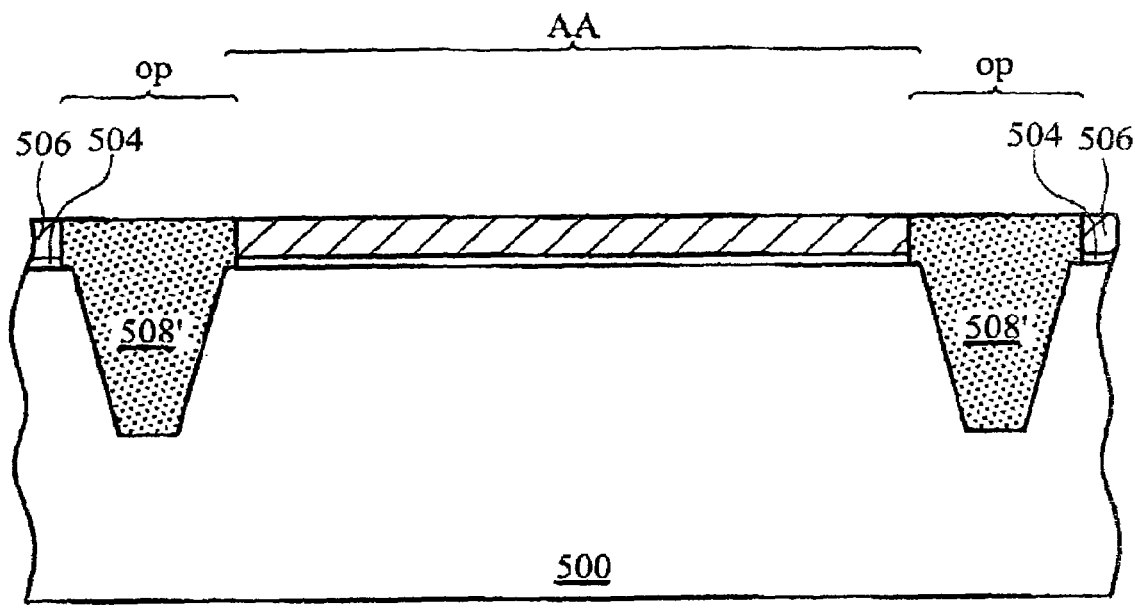
FIGS. 8a through 8e are cross sections illustrating strained-channel semiconductor structures in accordance with the fifth embodiment of the present invention.

In FIG. 8a, a substrate 500 composed of a first semiconductor material is provided. The substrate 500 may comprise a plurality of active areas (not shown) for forming devices thereon defined by a plurality of isolation structures (not shown) formed in the substrate 500. The active area AA defined by two adjacent isolation regions 502 is shown in FIG. 8a to simplify the description. First, a pad oxide layer 504 and a pad nitride layer 506 are sequentially formed on the substrate 500. Then a photolithography step and an etching step (not shown) are sequentially performed to form openings OP in the pad oxide layer 504 and the pad nitride layer 506. Next, an etching step is performed to etch the substrate 500 in the openings OP to form a recess in each opening OP. Then isolating material such as silicon dioxide is filled in the recess within the opening OP and is then leveled to form an isolation region 508 with a raised portion overhanging the substrate 500 and covers a portion of the substrate 500 in the adjacent active area. Thus, an active area AA defined by two adjacent isolation regions 502 is shown in FIG. 8a. The first semiconductor material of the substrate 500 can be elemental, alloy or compound semiconductor material and is preferably an elemental semiconductor material such as silicon. The isolation region 508 can be, for example, a conventional shallow trench isolation (STI) region.

Next, after the removal of the pad oxide layer 504 and the pad nitride layer 506, a first gate stack G including a gate dielectric layer 510, a gate electrode layer 512, and a mask layer 514 sequentially stacked over a portion of the substrate 500 within the active area AA is formed. The gate dielectric layer 510 can be formed by thermal oxidation, thermal oxidation followed by nitridation, chemical vapor deposition, physical vapor deposition such as sputtering, or other known techniques to form a gate dielectric layer. The gate dielectric layer 510 can be silicon dioxide, silicon nitride, silicon oxynitride, or combinations thereof with a thickness from about 3 Å to 100 Å, preferably approximately 10 Å or less. The gate dielectric layer 510 can also be a high permittivity (high-k) material with a relative permittivity greater than 8 such as aluminum oxide ($Al_2O_3$), hafnium oxide ($HfO_2$), zirconium oxide ($ZrO_2$) hafnium oxynitride (HfON), hafnium silicate ($HfSiO_4$), zirconium silicate ($ZrSiO_4$), lanthanum oxide ($La_2O_3$), or combinations thereof with an equivalent oxide thickness from about 3 Å to 100 Å. The gate electrode 512 can be polycrystalline-silicon (poly-Si), poly-crystalline silicon-germanium (poly-SiGe), refractory metal such as molybdenum or tungsten, compounds such as titanium nitride, combinations thereof, or another conductive material. In addition, implants known as workfunction implants can be introduced in the gate electrode 512 to alter the workfunction thereof. The mask layer 514 can be silicon nitride or silicon dioxide formed by chemical vapor deposition (CVD).

The gate stack G is formed by sequentially forming a dielectric layer (not shown), a gate electrode material layer (not shown), and a mask material layer (not shown) over the substrate 500. The mask material layer is then patterned to form a mask layer 514 for defining a gate electrode 512 and the gate electrode material layer and the dielectric layer are subsequently etched using the mask layer 514 as an etching mask to form the gate electrode 512 and the gate dielectric layer 510 and finally leaves the mask layer 514 thereon.

Thus, the gate electrode 512 is electrically isolated from the channel region by the gate dielectric layer 510. The gate dielectric layer 510 is preferably silicon oxynitride and gate electrode 512 is preferably poly-silicon etched using chlorine and bromine with a high etching selectivity respective to the gate dielectric later 510 when the substrate 500 comprises silicon material.

Next, an etching step (not shown), for example a plasma dry etching, is performed to etch the substrate 500 in the active area AA exposed by the first gate stack G and the overhanging portion of the isolation region 508. Thus, recesses 516 with a depth D are then oppositely formed in the substrate 500 adjacent to the first gate stack G. The depth D of each recess 516 can range from 50 Å to 2000 Å and preferably form 50 Å to 600 Å.

Then, the recess 516 is filled with a second semiconductor material 518 having a different natural lattice constant rather than that of the first semiconductor material of the substrate 500 through an epitaxy process (not shown) such as chemical vapor deposition, ultra-high vacuum chemical vapor deposition (UHV-CVD), or molecular beam epitaxy. The second semiconductor material can be elemental, alloy or compound semiconductor and is preferably an alloy semiconductor material including silicon and germanium, silicon and carbon or the combination of silicon, germanium and carbon.

Thus, a lattice-mismatched zone 520 is formed in each recess 516 and has an outer side and inner side corresponding to the first gate stack G, and the inner side thereof entirely and laterally contacts the substrate 500 below one side of the gate dielectric layer 510.

Figure 8B:
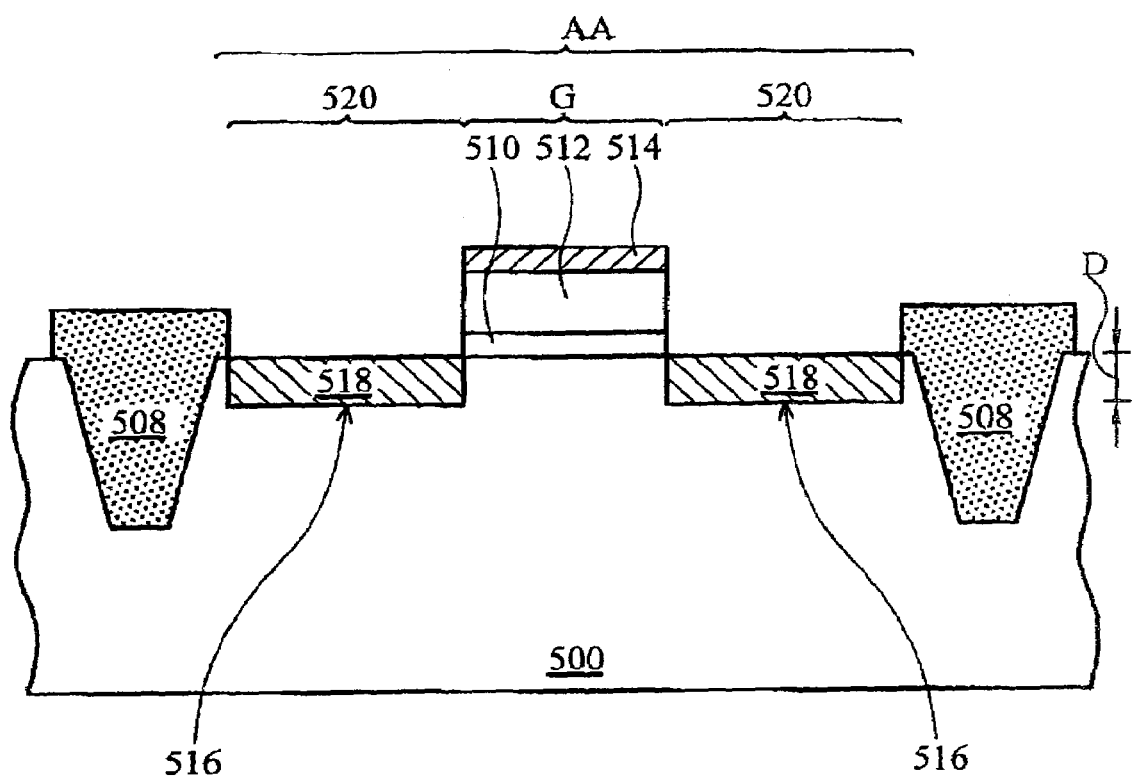
Figure 8C:
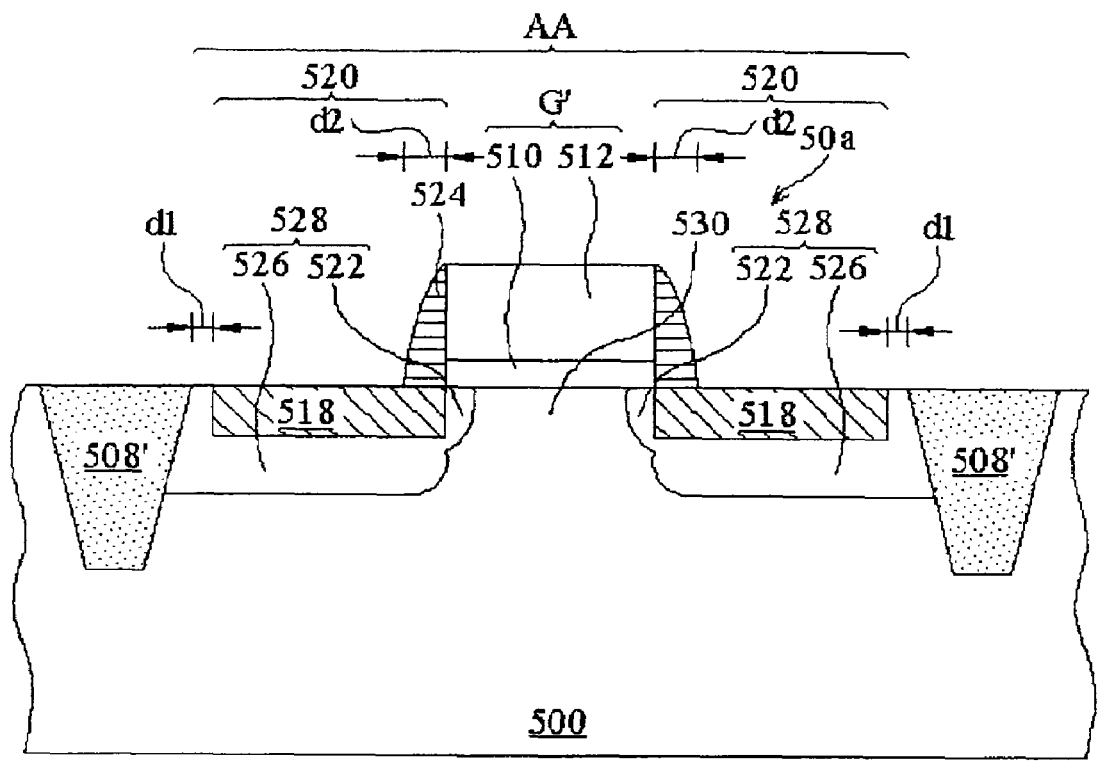

Next, as shown in FIG. 8c, after removal of the mask layer 514, a second gate stack G' remains over the substrate 500 in the active area AA. Then a source/drain extension region 522, a spacer 524 and a deeper source/drain region 526 are respectively formed in a portion of the silicon substrate 500 below the second gate stack G', on sidewalls of the second gate stack G' and in the substrate 500 adjacent to the second gate stack G' to form a strained-channel transistor 50a through conventional ion implantation processes for forming source/drain regions and spacers. The source/drain extension region 522 and the deeper source/drain region 526 comprise a source/drain region 528 with a lattice-mismatched zone 518 functioning as a stressor of exerting strain on the adjacent channel region and a strained-channel region 530 is thus formed in the substrate 500 and between the source/drain regions 528. Then the raised portion of each isolation region 508 is selectively removed and another isolation region 508' is left in the substrate 500.

It should be noted that the active area AA shown in FIG. 8c is defined by two isolation regions 508' and the outer side of each lattice-mismatched zones 520 is spaced entirely apart from the adjacent isolation region 508' by the first semiconductor material of the substrate 500 and does not laterally contact the adjacent isolation region 508', with a distance d1 more than 50 Å therebetween, such that the strain exerted on the strained-channel region 530 by each stressor (referring to the lattice-mismatched zone 520) is not easily reduced by the isolation region 508' and the strain on the strained-channel region 530 is optimized.

Figure 8D:
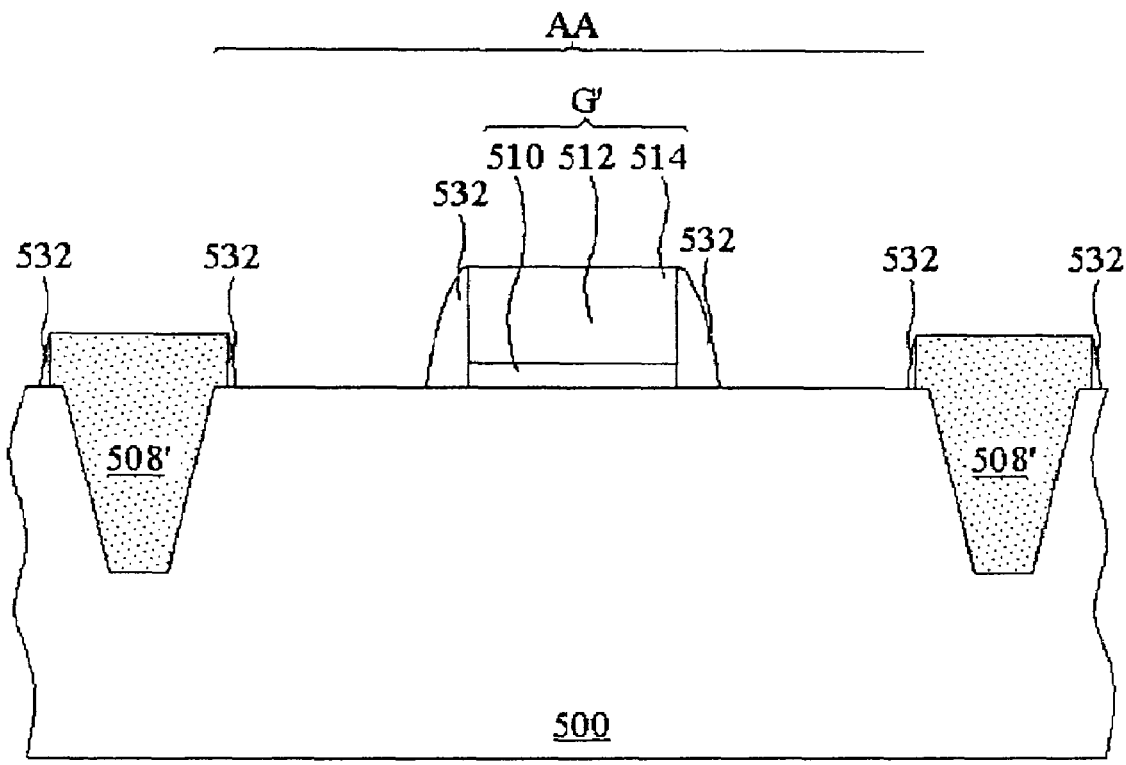

Moreover, before the formation of the recesses 516, a protective spacer 532 can be optionally formed on sidewalls of the first gate stack G and the overhanging portions of each isolation region 508 through sequential deposition and etching of a protective layer. At this point, the structure is illustrated in FIG. 8d. The material of the protective layer 428 can be silicon dioxide.

Figure 8E:
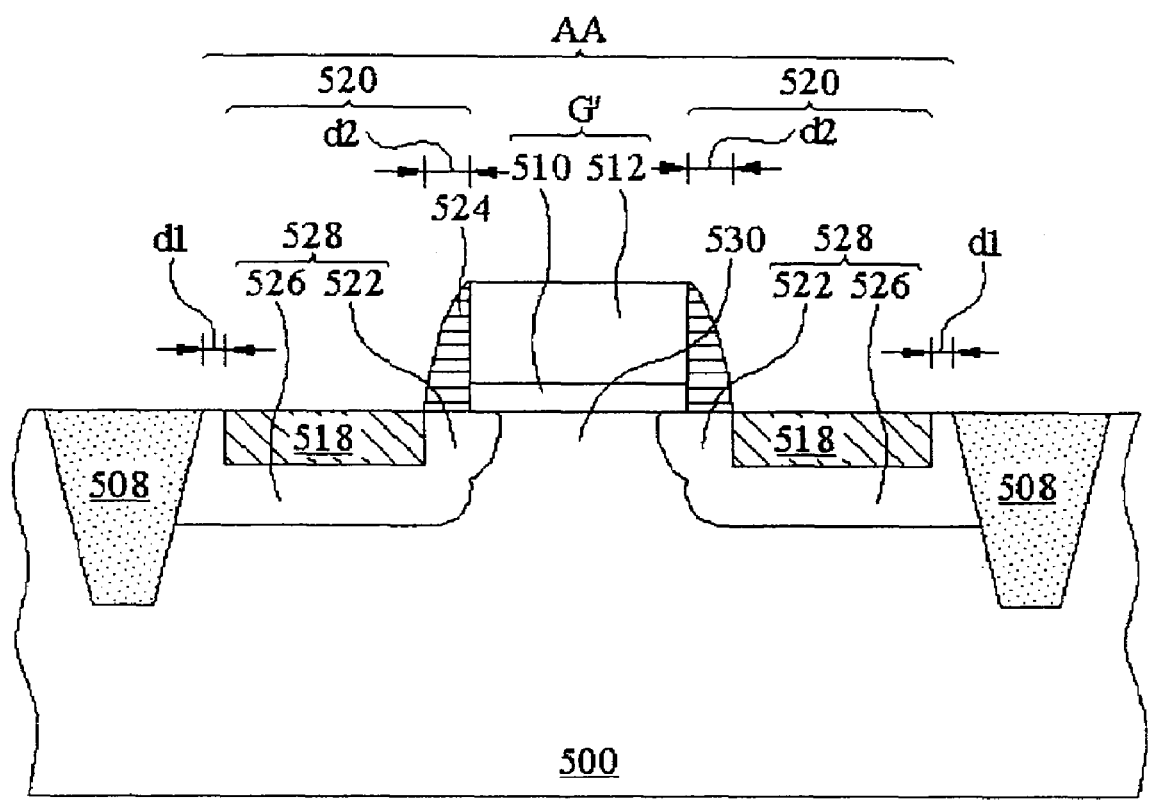

Next, the processes illustrated in FIG. 8b are performed subsequent to the removal of the protective spacers 532, a lattice-mismatched zone 520 with a displacement d2 between the inner side thereof and the substrate 500 below one side of the first gate stack C can thus be formed in subsequent processes, and the structure thereof is shown in FIG. 8e. The displacement d2 can be appropriately adjusted by changing the width of the protective spacer 532 (not shown) and preferably is less than 700 Å.

Then a strained-channel transistor 50b with displaced lattice-mismatched zones 520 can thus be formed through the subsequent processes illustrated in FIG. 8c and the overhanging portion of each isolation region 508 is then selectively removed and another isolation region 508' is left in the substrate 500 and the structure thereof is shown in FIG. 8e.

In the semiconductor structure with a strained-channel transistor shown in FIGS. 8c and 8d of this embodiment, the outer side of both of the lattice-mismatched zones 520 are spaced entirely apart from the adjacent isolation region 508' by the first semiconductor material of the substrate 500 such that the strain on the strained-channel region 530 exerted by each stressor (referring to the lattice-mismatched zone) is not easily reduced by the isolation region 508' and the strain on the strained-channel region 530 is optimized.

In addition, the strained-channel transistor 50a as shown in FIG. 8c can also be formed in an active area AA defined by one isolation region 508' through the described fabrication methods and the structure of the strained-channel transistor is not illustrated, for simplicity.

Further, a strained-channel semiconductor structure having the strained-channel transistor 50a/50b including a strained-channel region 530 between two lattice-mismatched zones therein are respectively shown in FIGS. 6c and 6e. The strained-channel semiconductor structure having the strained-channel transistor 50a in FIG. 8c comprises a substrate 500 composed of a first semiconductor material. A strained-channel region 530 is disposed in the substrate 500. A gate stack (referring to the second gate stack G') is disposed over the strained channel region 530, comprising a gate dielectric layer 510 and a gate electrode 512 sequentially stacked thereon. A pair of source/drain regions (referring to the source/drain regions 528) oppositely disposed in the substrate 500 adjacent to the strained-channel region 530, wherein each of the source/drain regions comprises a lattice-mismatched zone 520 comprising a second semiconductor material rather than the first semiconductor material of the substrate 500, an inner side and an outer side corresponding to the second gate stack G', and both of the outer sides laterally contacts the first semiconductor material of the substrate 500.

Moreover, applications of displaced lattice-mismatched zones, raised source/drain region, resistance reduction by a salicide process can be applied respectively or in combination on the lattice-mismatched zones 520 of the described semiconductor structures through the processes illustrated in the first embodiment of the present invention. Thus, different variations of the strained-channel semiconductor structure can be further formed but are not illustrated here, for simplicity.

In the strained-channel semiconductor structures in accordance with the present invention shown in FIGS. 8c and 8e, the substrate 500 preferably comprises silicon, with a natural lattice constant of approximately 5.431 Å, and the lattice-mismatched zone 530 preferably comprises an alloy semiconductor material such as a silicon-germanium (SiGe) alloy, with a natural lattice constant of between about 5.431

Å to 5.657 Å depending on concentration of germanium in the silicon-germanium alloy, greater than that of the substrate 500. The molar fraction of germanium in the silicon-germanium alloy of lattice-mismatched zone 520 is preferably between about 0.1 and 0.9. Therefore, the lattice-mismatched zone 520 functions as a stressor and exerts a compressive stress (not shown) in a lateral source/drain direction and tensile stress (not shown) in a vertical direction in the substrate 500 of the strained-channel region 530, resulting in strained channel region 530 under a compressive strain in the source/drain direction and tensile strain in the vertical direction. Hole mobility in the strained-channel region 530 is significantly enhanced, enhancing the drive current when the strained-channel transistor 50a and 50b in accordance with the present invention is a P-channel transistor structure. Furthermore, the lattice-mismatched zone 520 can further comprise carbon as a silicon-germanium-carbon alloy, in which the molar fraction of carbon is more than 0.001.

Further, the substrate 500 preferably comprises silicon and the lattice-mismatched zone 520 preferably comprises an alloy semiconductor material such as a silicon-carbon (SiC) alloy, with a natural lattice constant smaller than that of substrate 500. The molar fraction of carbon in the silicon-carbon alloy of lattice-mismatched zone 520 is preferably between about 0.01 and 0.04. Therefore, lattice-mismatched zone 520 functions as a stressor and exerts a tensile stress (not shown) in a lateral source/drain direction and compressive stress (not shown) in a vertical direction on the strained-channel region 530, resulting in strained-channel region 530 under a tensile strain in the lateral source/drain direction and compressive strain in the vertical direction. Electron mobility in the strained-channel region 530 is significantly enhanced, enhancing the drive current when the strained-channel transistor has an N-channel transistor structure. Furthermore, lattice-mismatched zone 520 can further comprise germanium as a silicon-carbon-germanium alloy, in which the molar fraction of germanium is more than 0.05.

Further, compressive strain and tensile strain on the strained-channel region 530 in FIGS. 8c and 8e are about 0.1% to 4%, preferably about 1% to 4%. Both lattice-mismatched zones 530 in FIGS. 8c and 8e are about 50 Å and 2000 Å thick, preferably about 50 Å to 600 Å. Compressive strain and tensile strain on the strained-channel region 530 in FIGS. 8c and 8e are dependent on lattice constants of lattice-mismatched zones 520, thickness of lattice-mismatched zones 520, and arrangement of lattice-mismatched zone 520 in source/drain regions.

Moreover, substrate 500 is N-type doped when the strained-channel transistor in FIGS. 8c and 8e are P-channel MOS transistors, or P-type doped when strained-channel transistor structure are N-channel MOS transistors.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of fabricating a strained-channel semiconductor structure, comprising:

providing a substrate with an active area thereon, wherein the substrate composed of a first semiconductor material with a first natural lattice constant and the active area is defined by at least one isolation region formed in the substrate;

forming at least one first gate stack over the active area, wherein each first gate stack comprises a gate dielectric layer, a gate electrode layer, and a mask layer sequentially stacked over a portion of the substrate therein;

etching the substrate to form a plurality of recesses in the substrate adjacent to the first gate stack;

filling each recess with a second semiconductor material comprising a second natural lattice constant rather than the first natural lattice constant as a lattice-mismatched zone; and removing the mask layer of each first gate stack to leave at least one second gate stack over the substrate and a pair of adjacent lattice-mismatched zones thereof in the substrate in the active area, wherein each lattice-mismatched zone has an inner side and an outer side corresponding to the adjacent second gate stack and the outer side of one of the lattice-mismatched zones on each end of the active area is spaced substantially apart from the isolation region by the first semiconductor material of the substrate.

2. The method as claimed in claim 1, wherein the isolation region is a tapered isolation and the outer side of one of the lattice-mismatched zones on each end substantially contacts the upper corner of the tapered isolation region.

3. The method as claimed in claim 1, wherein the outer side of one of the lattice-mismatched zones on each end does not contact the isolation region.

4. The method as claimed in claim 1, wherein a distance between the isolation region and the outer side of the adjacent lattice-mismatched zone is more than 50 Å.

5. The method as claimed in claim 1, wherein the isolation region has a raised isolation region with an overhanging portion above the substrate and covering the substrate in the adjacent active area such that the outer side of one of the lattice-mismatched zones formed in the substrate on each end of the active area do not contact the portion of the raised isolation region in the substrate.

6. The method as claimed in claim 5, wherein a distance between portions of the raised isolation in the substrate and the outer side of the adjacent lattice-mismatched zone is more than 50 Å.

7. The method as claimed in claim 1, before etching the exposed substrate to form a plurality of recesses in the substrate in the active area further comprises the step of forming at least one mask pattern over the isolation region, substantially covering the isolation region and a portion of the substrate of the adjacent active area thereof such that the outer side of one of the lattice-mismatched zones formed in the substrate on each end of the active area do not contact the isolation region in the substrate.

8. The method as claimed in claim 7, wherein a distance between the isolation region and the outer side of the adjacent lattice-mismatched zone is more than 50 Å.

9. The method as claimed in claim 1, further comprising the steps of:

forming a second spacer on sidewalls of each second gate stack, substantially covering a portion of the adjacent lattice-mismatched zones thereof; and forming a pair of source/drain regions in the substrate adjacent to each second gate stack to form at least one MOS transistor, wherein each source/drain region comprises the lattice-mismatched zone.60. The method as claimed in claim 1, before forming a second spacer on sidewalls of each second gate stack, further comprising the step of forming a source/drain extension region in a portion of the substrate below each second gate stack and portions of the lattice-mismatched zones adjacent to each second gate stack.

10. The method as claimed in claim 1, before forming a second spacer on sidewalls of each second gate stack, further comprising the step of forming a source/drain extension region in a portion of the substrate below each second gate stack and portions of the lattice-mismatched zones adjacent to each second gate stack.

11. The method as claimed in claim 1, wherein a plurality of first gate stacks are formed over the active area such that a plurality of second gate stacks having a plurality of the adjacent lattice-mismatched zones alternatively disposed in the adjacent substrate thereof are left over the active area, and each lattice-mismatched zone has a inner side and an outer side corresponding to the adjacent second gate stack and the outer side of one of the lattice-mismatched zones on each end of the active area spaced substantially apart from the isolation region by the first semiconductor material of the substrate.

12. The method as claimed in claim 11, wherein the outer side of one of the lattice-mismatched zones on each end does not contact the isolation region and a distance between the isolation region and the outer side of the adjacent lattice-mismatched zone is more than 50 Å.

13. The method as claimed in claim 11, wherein the isolation region is a raised isolation region having a overhanging portion above the substrate and covering the substrate in the adjacent active area such that the outer side of one of the lattice-mismatched zones formed in the substrate on each end of the active area do not contact portions of the raised isolation region in the substrate.

14. The method as claimed in claim 13, wherein a distance between portions of the raised isolation in the substrate and the outer side of the adjacent lattice-mismatched zone is more than 50 Å.

15. The method as claimed in claim 11, before etching the exposed substrate to form a plurality of recesses in the substrate in the active area further comprising the step of forming at least one mask pattern over the isolation region, substantially covering the isolation region and a portion of the substrate of the adjacent active area thereof such that the outer side of one of the lattice-mismatched zones formed in the substrate on each end of the active area do not contact the isolation region in the substrate.

16. The method as claimed in claim 15, wherein a distance between the isolation region and the outer side of the adjacent lattice-mismatched zone is more than 50 Å.

17. The method as claimed in claim 1, before etching the exposed substrate to form a plurality of recesses in the substrate in the active area further comprising the step of forming two mask patterns over each isolation region, substantially covering the isolation region and a portion of the substrate of the adjacent active area thereof such that the outer side of both of the lattice-mismatched zones formed in the substrate on each end of the active area do not contact the isolation region in the substrate.

18. The method as claimed in claim 1, wherein the lattice-mismatched zone is about 50 to 2000 Å thick.

19. The method as claimed in claim 1, wherein the first semiconductor material is silicon.

20. The method as claimed in claim 1, wherein the second semiconductor material selected from the group consisting of SiGe, SiC and SiGeC.

21. The method as claimed in claim 9, wherein the second natural lattice constant is greater than the first natural lattice constant.

22. The method as claimed in claim 20, wherein the molar fraction of germanium in the second semiconductor material is larger than 0.05.

23. The method as claimed in claim 20, wherein the molar fraction of carbon in the second semiconductor material is larger than 0.001.

24. The method as claimed in claim 21, wherein the MOS transistor is a p-channel metal-oxide semiconductor (PMOS) transistor.

25. The method as claimed in claim 9, wherein the second natural lattice constant is smaller than the first natural lattice constant.

26. The method as claimed in claim 25, wherein the MOS transistor is an n-channel metal-oxide semiconductor (NMOS) transistor.

27. The method as claimed in claim 1, wherein the second semiconductor material is filled in the recesses by an epitaxy process using chemical vapor deposition, ultra-high vacuum chemical vapor deposition, or molecular beam epitaxy.

28. The method as claimed in claim 1, further comprising the steps of:
    forming a second spacer on sidewalls of each second gate stack, substantially covering a portion of the adjacent lattice-mismatched zones thereof;
    selectively forming a cap layer on each lattice-mismatched zone, wherein each cap layer has a thickness less than 400 Å above the gate dielectric layer; and
    forming a pair of source/drain regions in the substrate adjacent to each second gate stack and the cap layer to form at least one MOS transistor with raised source/drain regions, wherein each raised source/drain region comprises the lattice-mismatched zone.

29. The method as claimed in claim 28, wherein the cap layer is a semiconductor material.

30. The method as claimed in claim 28, further comprising the step of partially salicidizing each raised source/drain region and each gate electrode.

31. The method as claimed in claim 1, wherein the gate dielectric layer is silicon oxide, silicon nitride or silicon oxynitride.

32. The method as claimed in claim 1, wherein the relative permittivity of the gate dielectric layer is greater than 8.

33. The method as claimed in claim 32, wherein the gate dielectric layer is Al2O3, HfO2, ZrO2, HfON, HfSiO4, ZrSiO4, La2O3, or combinations thereof.

34. The method as claimed in claim 1, wherein the gate dielectric layer is about 3 to 100 Å thick.

35. The method as claimed in claim 1, wherein the gate electrode is selected from the group consisting of poly-crystalline silicon, poly-crystalline silicon germanium, metal and metal silicide.

36. The method as claimed in claim 1, wherein the substrate is a semiconductor on insulator (SOI) substrate.

* * * * *